United States Patent
Murayama et al.

(10) Patent No.: US 11,959,624 B2
(45) Date of Patent: Apr. 16, 2024

(54) LIGHT EMITTING DEVICE

(71) Applicant: HAMAMATSU PHOTONICS K.K., Hamamatsu (JP)

(72) Inventors: Kyoichi Murayama, Hamamatsu (JP); Yoshiteru Miyamoto, Hamamatsu (JP); Ryotaro Matui, Hamamatsu (JP); Hiroya Kashiwabara, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/764,267

(22) PCT Filed: Sep. 10, 2020

(86) PCT No.: PCT/JP2020/034268
§ 371 (c)(1),
(2) Date: Mar. 28, 2022

(87) PCT Pub. No.: WO2021/065407
PCT Pub. Date: Apr. 8, 2021

(65) Prior Publication Data
US 2022/0373170 A1    Nov. 24, 2022

(30) Foreign Application Priority Data
Oct. 3, 2019 (JP) .................. 2019-183020

(51) Int. Cl.
*F21V 29/60* (2015.01)
*F21V 29/503* (2015.01)
(Continued)

(52) U.S. Cl.
CPC ............ *F21V 29/503* (2015.01); *F21V 29/60* (2015.01); *F21V 29/76* (2015.01); *F21V 29/83* (2015.01)

(58) Field of Classification Search
CPC ................................. F21V 29/60; F21V 29/83
See application file for complete search history.

(56) References Cited

U.S. PATENT DOCUMENTS 3,766,377 A * 10/1973 Junginger ............. F21V 21/403
362/232
3,792,230 A * 2/1974 Ray ...................... B23K 1/0053
338/237

FOREIGN PATENT DOCUMENTS

CN      101598321 A    12/2009
CN      105276552 A    1/2016
(Continued)

OTHER PUBLICATIONS

International Preliminary Report on Patentability dated Apr. 14, 2022 for PCT/JP2020/034268.

*Primary Examiner* — Sean P Gramling
(74) *Attorney, Agent, or Firm* — Faegre Drinker Biddle & Reath LLP

(57) ABSTRACT

A light emitting device includes a housing; a light source unit; and a cooling unit provided in the housing to discharge heat to an outside of the housing by means of a gas, the heat being generated by the light source unit. The cooling unit includes an introduction portion, a heat exchange portion, and a circulation portion that guides the gas from the introduction portion to the heat exchange portion. The circulation portion includes a first flow path receiving the gas from the introduction portion, and a second flow path receiving the gas from the first flow path, and being connected to the heat exchange portion. The first flow path includes a portion having a flow path area larger than a flow path area of the introduction portion.

12 Claims, 17 Drawing Sheets

(51) Int. Cl.
*F21V 29/76* (2015.01)
*F21V 29/83* (2015.01)

(56) References Cited

FOREIGN PATENT DOCUMENTS

| | | |
|---|---|---|
| JP | 2006-294299 A | 10/2006 |
| JP | 2011-165509 A | 8/2011 |
| JP | 2012-033742 A | 2/2012 |
| JP | 2016-122093 A | 7/2016 |
| JP | 2018-073692 A | 5/2018 |
| TW | 201022586 A | 6/2010 |

\* cited by examiner

LIGHT EMITTING DEVICE

TECHNICAL FIELD

The present invention relates to a light emitting device.

BACKGROUND ART

A light source of a light emitting device generates heat when the light source emits light. The heat raises the temperature of the light source. The temperature of the light source affects a light output of the light source. Hence, the light emitting device may adopt a forced air cooling mechanism. The forced air cooling mechanism forcibly provides air to a heat radiation member.

CITATION LIST

Patent Literature

Patent Literature 1: Japanese Unexamined Patent Publication No. 2012-33742

SUMMARY OF INVENTION

Technical Problem

Patent Literature 1 discloses a light emitting device including a forced air cooling mechanism. The device of Patent Literature 1 provides an airflow to a heat radiation member by using a known air blower as the forced air cooling mechanism.

Another example of a forced air cooling mechanism is a configuration using compressed air. According to the mechanism using the compressed air, turbulence is likely to be generated in the flow of gas. When turbulence is generated in the flow of gas to be provided to a heat radiation member, a portion that is relatively cool because of easy transfer of heat and a portion that is relatively hot because of difficult transfer of heat are generated in the heat radiation member. As a result, a hot portion and a cool portion are generated in a light source. Further, a temperature difference between the hot portion and the cool portion tends to increase. The temperature of the light source affects a light output of the light source. Namely, when the temperature difference between the hot portion and the cool portion in the light source increases, a variation is generated in the light output of the light source.

An object of the present invention is to provide a light emitting device capable of making a light output as uniform as possible.

Solution to Problem

According to one aspect of the present invention, there is provided a light emitting device including: a housing; a light source unit accommodated in the housing to emit light from a light emitting window of the housing; and a cooling unit provided in the housing to discharge heat to an outside of the housing by means of a gas, the heat being generated by the light source unit. The cooling unit includes an introduction portion that receives a provision of the gas that is compressed, a heat exchange portion that causes the gas to receive the heat generated by the light source unit, and a circulation portion that guides the gas from the introduction portion to the heat exchange portion. The circulation portion includes a first flow path being connected to the introduction portion and extending along a first direction, and a second flow path being connected to the first flow path, extending along a second direction intersecting the first direction, and being connected to the heat exchange portion. The first flow path includes a portion having a flow path area larger than a flow path area of the introduction portion.

The light emitting device includes the cooling unit that discharges the heat to the outside of the housing by means of the gas, the heat being generated by the light source unit. The cooling unit receives the gas that is a heat medium from the introduction portion. Then, the received gas is provided to the heat exchange portion via the circulation portion. Since the gas is compressed, the gas has fluid energy caused by the compression. First, the gas moves from the introduction portion to the first flow path of the circulation portion. When the gas moves from the introduction portion to the first flow path, the flow path area expands. As a result, when the gas moves from the introduction portion to the first flow path of the circulation portion, the fluid energy of the gas is reduced. Further, while the gas moves to the heat exchange portion, the gas passes through the first flow path and the second flow path of the circulation portion. Here, a direction of the second flow path intersects a direction of the first flow path. In that case, a flow direction of the gas changes when the gas moves from the first flow path to the second flow path. At this time, the fluid energy of the gas is further reduced. As a result, the gas of which the fluid energy is sufficiently reduced is provided to the heat exchange portion, so that the turbulence of the flow of the gas in the heat exchange portion is suppressed. Therefore, the flow of the gas in the heat exchange portion is made uniform, so that a deviation in the amount of heat moving from the heat exchange portion to the gas is eliminated. As a result, a temperature variation of the light source unit is reduced, and the light output can be made as uniform as possible.

In the light emitting device, the introduction portion may be disposed on a back surface side of the housing opposite to a main surface of the housing, the emitting window being provided in the main surface. According to this configuration, a path that guides the gas to the heat exchange portion can be simplified.

In the light emitting device, the heat exchange portion may include a receiving port connected to the circulation portion, a heat radiation member that causes the gas to receive the heat generated by the light source unit, and an exhaust port that discharges the gas that has received the heat generated by the light source unit. According to this configuration, the gas flows in from the receiving port. Then, the gas passes through the heat radiation member, and then flows out from the exhaust port. Therefore, a flow direction of the gas can be determined to be directed from the receiving port toward the exhaust port.

In the light emitting device, the number of the receiving ports of the heat exchange portion may be 2 or more. According to this configuration, a distance by which the gas moves to reach the exhaust port after flowing out from each of the receiving ports is shortened. As a result, a deviation in the temperature of the light source unit can be further reduced.

In the light emitting device, the light source unit may include a light emitting surface on which a light emitting element emitting the light is disposed, and a connection surface opposite to the light emitting surface. The heat radiation member may be disposed on a connection surface side. According to this configuration, heat of the light source unit can be reliably transferred to the heat radiation member.

In the light emitting device, the circulation portion may be disposed inside the housing. According to this configuration, the light emitting device can be reduced in size.

In the light emitting device, the circulation portion may be disposed outside the housing. According to this configuration, the degree of freedom of a configuration of the circulation portion can be improved.

In the light emitting device, the cooling unit may include a cooling block in which the heat exchange portion and the circulation portion are formed. The circulation portion may be a space formed by cutting out a part of the cooling block. According to this configuration, the light emitting device including the cooling unit can be easily assembled.

In the light emitting device, the circulation portion may be a pipe member disposed in the housing. According to this configuration, the degree of freedom of a configuration of the circulation portion can be improved.

In the light emitting device, the number of the introduction portions of the cooling unit may be 2 or more. According to this configuration, the flow rate of the gas can be easily increased.

In the light emitting device, the gas may be air or nitrogen. According to this configuration, heat from the heat radiation member can be reliably received.

In the light emitting device, the heat radiation member may be a heat sink including a plurality of fins. According to this configuration, an efficiency of passing heat to the gas can be improved.

In the light emitting device, the housing may include an exhaust window that further discharges the gas to the outside, the gas being discharged from the exhaust port. The exhaust window may be provided in a central portion of the housing. According to this configuration, the gas that has received heat can be reliably discharged to the outside of the housing.

Advantageous Effects of Invention

According to the light emitting device of the present invention, the light output can be made as uniform as possible.

DESCRIPTION OF EMBODIMENTS

Hereinafter, modes for carrying out the present invention will be described in detail with reference to the accompanying drawings. In the description of the drawings, the same elements are denoted by the same reference signs, and duplicated descriptions will be omitted.

Figure 1:
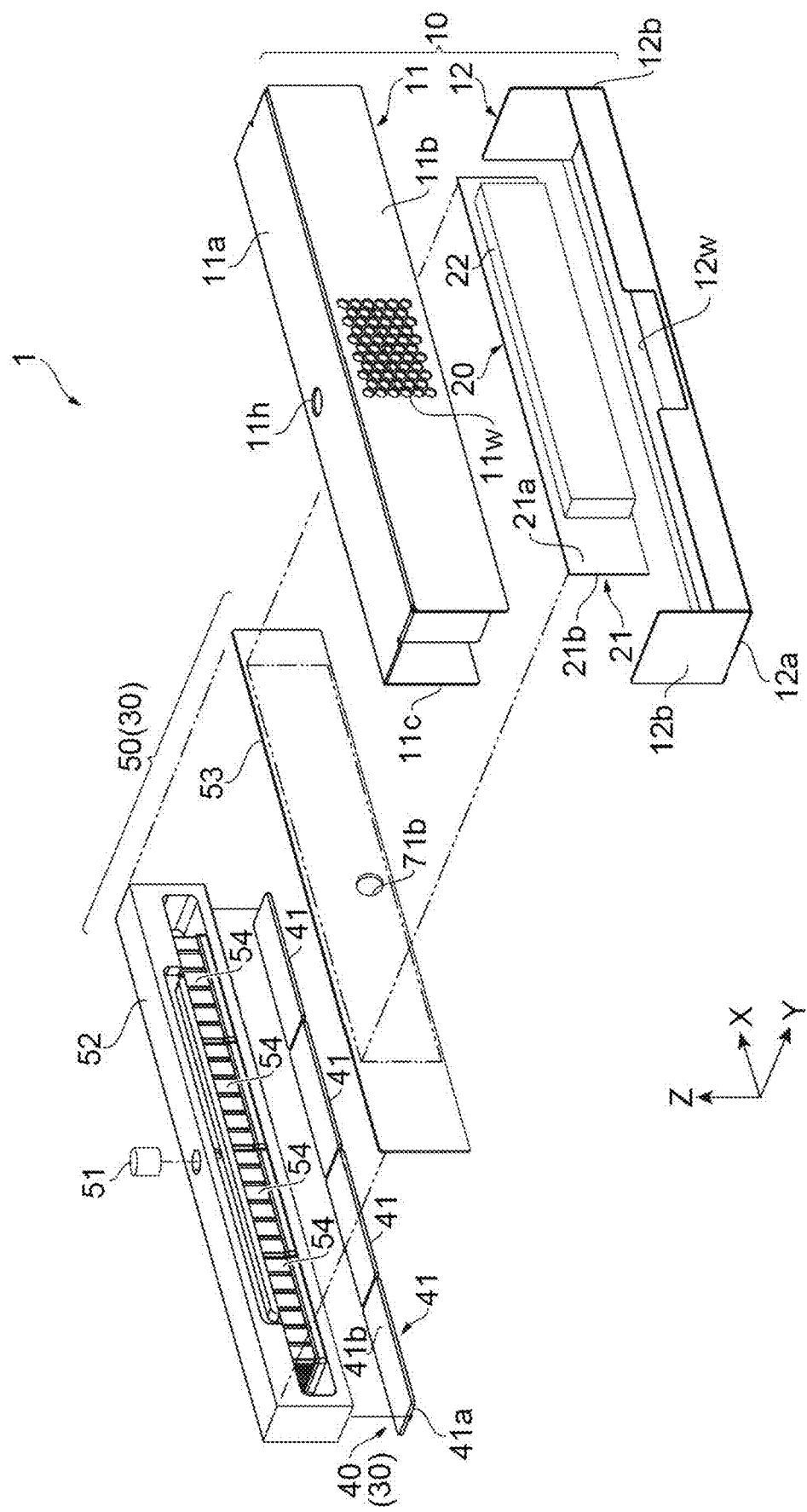
FIG. 1 is an exploded perspective view illustrating a light emitting device of a first embodiment.

As illustrated in FIG. 1, a light emitting device 1 has a long shape. The light emitting device 1 emits light in a predetermined direction. In the following description, a light emission direction is a Z direction (first direction). In addition, the light emitting device 1 includes a forced air cooling mechanism for a light source that emits light. The forced air cooling mechanism uses compressed gas to be provided from the outside as a heat medium. The forced air cooling mechanism discharges heat to the outside by causing the gas to receive heat generated from the light source. The gas may be, for example, air or nitrogen.

The light emitting device 1 includes a housing 10, a circuit unit 20, and a light emitting unit 30.

The housing 10 accommodates the circuit unit 20 and the light emitting unit 30. The housing 10 is a long rectangular parallelepiped extending in a predetermined direction. A longitudinal direction of the housing 10 is an X direction (second direction). The housing 10 includes an upper case 11 and a lower case 12. The upper case 11 and the lower case 12 are combined with each other to form a space that accommodates the circuit unit 20 and the light emitting unit 30.

The upper case 11 includes a case upper surface 11a, a case front surface 11b, and a case rear surface 11c. The case upper surface 11a is a back surface of the housing 10. The upper case 11 includes a connector hole 11h and an exhaust window 11w. The connector hole 11h is an inlet for the compressed gas. The connector hole 11h is provided in the case upper surface 11a. The exhaust window 11w is an outlet for the gas that has received heat. The exhaust window 11w is provided in the case front surface 11b. The lower case 12 includes a case lower surface 12a and a case end surface 12b. The case lower surface 12a is a main surface of the housing 10. The lower case 12 includes a light emitting window 12w. The light emitting window 12w is provided in the case lower surface 12a. Namely, in the housing 10, a surface that emits light (case lower surface 12a) is a surface opposite to a surface that receives the gas (case upper surface 11a).

Incidentally, the discharge of the gas from the exhaust window 11w may be natural exhaust or forced exhaust. For example, a duct may be provided in the exhaust window 11w to suppress the turbulence of airflows around the light emitting device 1.

The circuit unit 20 provides electrical functions required for operation of the light emitting device 1. For example, the circuit unit 20 supplies electric power for emitting light to the light emitting unit 30. The circuit unit 20 includes a circuit substrate 21 and an electronic component 22. The electronic component 22 is disposed on a main surface 21a of the circuit substrate 21. The main surface 21a of the circuit substrate 21 faces the case front surface 11b.

The light emitting unit 30 emits light. Further, the light emitting unit 30 causes heat to transfer to the outside, the heat being generated because of the generation of the light. The light emitting unit 30 is disposed between the circuit substrate 21 and the case rear surface 11c. The light emitting unit 30 faces a back surface 21b of the circuit substrate 21. The light emitting unit 30 includes a light source unit 40 and a cooling unit 50.

A light emitting characteristic of a light emitting element provided in the light source unit 40 is affected by temperature. For example, when the light source unit 40 becomes hot, a characteristic of light to be emitted changes. Further, when there is a temperature variation inside the light source unit 40, a variation is also generated in the characteristic of the light to be emitted. Hence, the cooling unit 50 prevents the temperature of the light source unit 40 from becoming too high, and reduces the temperature variation in the light source unit 40. For example, the range of the temperature variation (temperature difference) in the light source unit 40 may be within 10° C. Further, the temperature difference is preferably within 8° C. and more preferably within 5° C.

The light source unit 40 generates light. The light may be, for example, ultraviolet light. The light source unit 40 is accommodated in the housing 10. The light source unit 40 includes four light emitting panels 41. The light emitting panel 41 includes a light emitting surface 41a on which light emitting diodes 42 (light emitting elements, refer to FIG. 3) emitting ultraviolet light are disposed, and a connection surface 41b on a back side with respect to the light emitting surface 41a. The light source unit 40 is disposed between the cooling unit 50 and the case lower surface 12a. The light emitting surface 41a faces the light emitting window 12w. The connection surface 41b of the light emitting panel 41 is in contact with the cooling unit 50.

Figure 2:
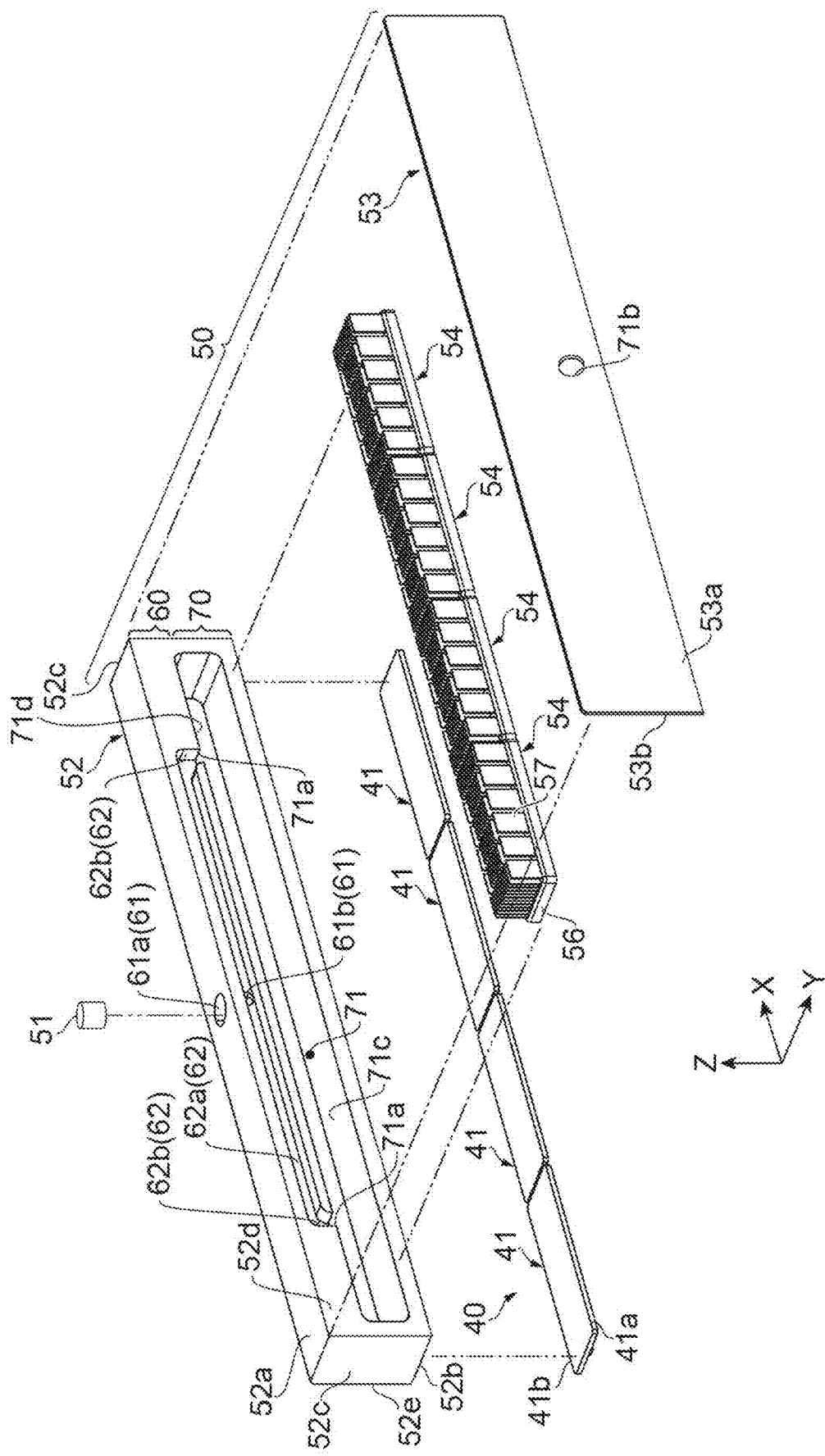
FIG. 2 is an exploded perspective view illustrating a cooling unit of FIG. 1.

As illustrated in FIG. 2, the cooling unit 50 includes an introduction portion 51, a cooling block 52, a cover 53, and a heat sink 54 as physical elements. The cooling block 52 includes a block upper surface 52a, a block lower surface 52b, a pair of block end surfaces 52c, a block front surface 52d, and a block rear surface 52e. The cooling unit 50 includes the introduction portion 51, a circulation portion 60, and a heat exchange portion 70 from the viewpoint of functionality. The introduction portion 51, the circulation portion 60, and the heat exchange portion 70 are disposed in order from the block upper surface 52a toward the block lower surface 52b (Z direction). The arrangement order coincides with order in which the gas flows.

The introduction portion 51 is a connecting component that connects a gas pipe (not illustrated) to the cooling block 52. The introduction portion 51 is connected to the circulation portion 60 via the connector hole 11h of the upper case 11.

The gas to be received by the introduction portion 51 may be high-pressure air. The high-pressure air is compressed air to be obtained from an air supply facility that is generally disposed in a factory. Such an air supply facility is configured to include a compressor, an aftercooler, a tank, an air filter, an air dryer, an air regulator, and the like. Then, pressure is adjusted at the end of the air supply facility by the air regulator for pressure adjustment. As a result, the compressed air of a desired pressure can be used. Normally, the pressure of the compressed air to be supplied in a factory or the like is approximately 1 MPa. Therefore, the pressure of the gas to be received by the introduction portion 51 may be 1 MPa. Further, the introduction portion 51 may receive the compressed air of which the pressure is lowered less than 1 MPa. For example, the pressure of the gas to be received by the introduction portion 51 may be 0.3 MPa. Namely, the range of the pressure of the gas to be received by the introduction portion 51 may be a range from a maximum pressure of the compressed air to be supplied from a factory facility or less to higher than the atmospheric pressure.

The circulation portion 60 guides the gas provided to the introduction portion 51 to the heat exchange portion 70. Namely, the circulation portion 60 forms a flow path for the gas. The circulation portion 60 is formed of some holes and grooves provided in the cooling block 52, and the cover 53. The circulation portion 60 includes a first flow path 61 and a second flow path 62.

The first flow path 61 receives the gas from the introduction portion 51. Then, the first flow path 61 passes the gas to the second flow path 62. The first flow path 61 includes a flow path hole 61a and a connection hole 61b.

The flow path hole 61a is a hole extending from the block upper surface 52a toward the block lower surface 52b. Namely, the flow path hole 61a extends in the Z direction. The flow path hole 61a includes an opening formed in the block upper surface 52a. The introduction portion 51 is connected to the opening. The flow path hole 61a includes a bottom.

The connection hole 61b is a hole extending from the block rear surface 52e toward the block front surface 52d. Namely, the connection hole 61b extends in a Y direction. An extending direction (Y direction) of the connection hole 61b intersects an extending direction (Z direction) of the flow path hole 61a. Specifically, the extending direction of the connection hole 61b is orthogonal to the extending direction of the flow path hole 61a. Namely, the flow path hole 61a and the connection hole 61b form an L-shaped flow path. The connection hole 61b is a through-hole. One end of the connection hole 61b is connected to the flow path hole 61a. The other end of the connection hole 61b is connected to the second flow path 62.

The second flow path 62 receives the gas from the first flow path 61. Then, the second flow path 62 passes the gas to the heat exchange portion 70. The second flow path 62 includes a flow path groove 62a and a connection groove 62b.

The flow path groove 62a is a groove extending from one block end surface 52c toward the other block end surface 52c. Namely, the flow path groove 62a extends in the X direction. An extending direction of the flow path groove 62a is aligned with a longitudinal direction of the light emitting device 1. The extending direction (X direction) of the flow path groove 62a intersects the extending direction (Y direction) of the connection hole 61b. Specifically, the extending direction of the flow path groove 62a is orthogonal to the extending direction of the connection hole 61b. The flow path groove 62a is dug from the block front surface 52d toward the block rear surface 52e. The flow path groove 62a includes an opening formed in the block front surface 52d. The opening is closed by the cover 53. A position at which the flow path groove 62a is connected to the connection hole 61b is substantially the center in the extending direction (X direction) of the flow path groove 62a. The connection grooves 62b are connected to both ends of the flow path groove 62a. Namely, the cooling block 52 is provided with two connection grooves 62b.

The flow path area is expanded in a portion in which the flow path groove 62a is connected to the connection groove 62b. The portion of which the flow path area is expanded is referred to as a widened portion 62s (refer to FIG. 3). The flow path area may be an area of a flow path cross section orthogonal to a flow line. In that case, a flow direction of the gas changes in a portion in which the flow path groove 62a is connected to the connection groove 62b. The flow path area changes at the corner. Specifically, the flow path area gradually increases from the flow path groove 62a toward the widened portion 62s. Then, the flow path area gradually decreases from the widened portion 62s toward the connection groove 62b. Incidentally, the flow path area may be constant from the widened portion 62s toward the connection groove 62b.

The connection groove 62b extends from the block upper surface 52a toward the block lower surface 52b. Namely, the connection groove 62b extends in the Z direction. Similarly to the flow path groove 62a, the connection groove 62b is dug from the block front surface 52d toward the block rear surface 52e. A depth of the connection groove 62b may be the same as a depth of the flow path groove 62a. The flow path groove 62a includes an opening formed in the block front surface 52d. The opening of the flow path groove 62a is closed by the cover 53. One end of the connection groove 62b is connected to the second flow path 62. The other end of the connection groove 62b is connected to the heat exchange portion 70.

The heat exchange portion 70 causes the gas to receive heat generated by the light source unit 40. The heat exchange portion 70 includes a third flow path 71 and the heat sink 54 (heat radiation member).

The third flow path 71 provides a space serving to exchange heat. Namely, the third flow path 71 accommodates the heat sink 54. Similarly to the flow path groove 62a, the third flow path 71 extends from the one block end surface 52c toward the other block end surface 52c. Namely, the third flow path 71 extends in the X direction. A length of the third flow path 71 in the X direction may be longer than a length of the second flow path 62. An extending direction (X direction) of the third flow path 71 intersects an extending direction (Z direction) of the connection groove 62b. Specifically, the extending direction (X direction) of the third flow path 71 is orthogonal to the extending direction (Z direction) of the connection groove 62b.

The third flow path 71 is dug from the block front surface 52d toward the block rear surface 52e. A depth of the third flow path 71 is deeper than the depth of the flow path groove 62a of and the depth of the connection groove 62b of the second flow path 62. In other words, a bottom surface of the third flow path 71 is located closer to a block rear surface 52e side than a bottom surface of the second flow path 62. The third flow path 71 includes an opening formed in the block front surface 52d. The opening of the third flow path 71 is closed by the cover 53.

The third flow path 71 includes a receiving port 71a connected to the connection groove 62b. As described above, the cooling block 52 includes the two connection grooves 62b. Therefore, the third flow path 71 includes two receiving ports 71a. The receiving port 71a may be provided, for example, at a position at which a distance from the one block end surface 52c to the receiving port 71a is ¼ the length of the cooling block 52. For example, when the first flow path 61 is assumed as being provided at the center of the cooling block 52, the receiving port 71a may be provided at the center of a distance from the block end surface 52c to the first flow path 61. In addition, the receiving ports 71a may be provided directly above the heat sinks 54 disposed at both ends among four heat sinks 54.

The third flow path 71 includes an exhaust port 71b. The exhaust port 71b is provided in the cover 53. The exhaust port 71b is provided between a pair of the receiving ports 71a. Specifically, the exhaust port 71b is provided substantially at the center in a longitudinal direction (X direction) of the cover 53.

The heat sinks 54 pass heat to the gas. The heat sinks 54 are disposed in the third flow path 71. The heat sinks 54 do not protrude from the third flow path 71. In other words, a width of the heat sink 54 is shorter than the depth of the third flow path 71. The heat sinks 54 are disposed symmetrically with respect to the center of the cooling block 52 as an axis. The heat sink 54 includes a fin base 56 and a plurality of fins 57. The fin base 56 is in contact with a lower wall surface 71c of the third flow path 71. The lower wall surface 71c is located on a back surface side with respect to the block lower surface 52b. In other words, the lower wall surface 71c and the block lower surface 52b are interposed between the fin base 56 and the light source unit 40.

The plurality of fins 57 are plate-shaped members extending upward from the fin base 56. Upper ends of the fins 57 are not in contact with an upper wall surface 71d of the third flow path 71. The plurality of fins 57 are disposed to be separated from each other in a depth direction (Y direction) of the third flow path 71. As a result, a plurality of grooves are formed in a direction from the one block end surface 52c toward the other block end surface 52c. In addition, a plurality of the fins 57 may be disposed in the X direction.

Figure 3:
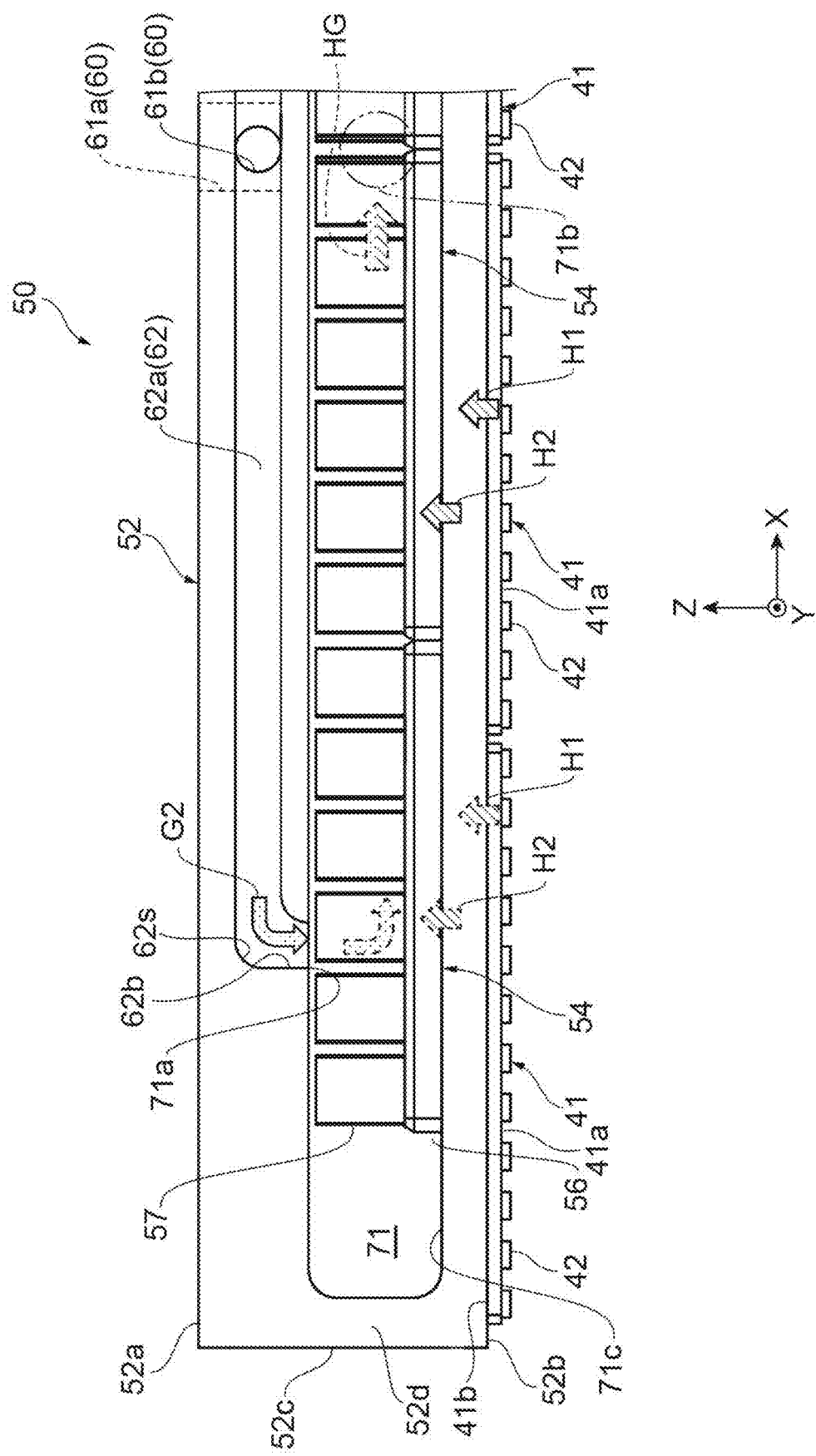
FIG. 3 is an enlarged plan view illustrating a part of the cooling unit.

As illustrated in FIG. 3, the gas moves in order of the introduction portion 51 (refer to FIG. 1), the circulation portion 60, and the heat exchange portion 70. First, the gas moves from the gas pipe to the introduction portion 51. Next, the gas moves from the introduction portion 51 to the circulation portion 60. Next, the gas moves in order of the first flow path 61 and the second flow path 62 in the circulation portion 60. In more detail, the gas moves from the flow path hole 61a of the first flow path 61 to the second flow path 62 via the connection hole 61b.

Here, a flow path area of the flow path hole 61a is larger than a flow path area of the introduction portion 51. In a case where each of the flow path hole 61a and the introduction portion 51 is assumed as being a pipeline, when the size of a cross-sectional area of the pipeline changes, a fluid energy loss is generated because of a change in the cross-sectional area. The fluid energy loss causes a pressure loss. The gas moving through the introduction portion 51 has a high pressure. However, the pressure of the gas decreases because of an expansion from the flow path area of the introduction portion 51 to the flow path area of the flow path hole 61a. Namely, the momentum of the high-pressure gas weakens. Further, the extending direction of the connection hole 61b is different from the extending direction of the flow path hole 61a. According to this configuration, the gas moving inside the flow path hole 61a collides with a bottom surface of the flow path hole 61a. The collision dissipates a part of the fluid energy of the gas. As a result, the fluid energy of the gas is further reduced.

Next, the gas that has moved to the flow path groove 62a of the second flow path 62 branches into a flow toward the one block end surface 52c and a flow toward the other block end surface 52c. Next, the branched gas moves to the heat exchange portion 70 via the connection grooves 62b (refer to arrow G2). Here, the extending direction of the flow path groove 62a is different from the extending direction of the connection groove 62b. In that case, the gas collides with a wall surface of the flow path groove 62a or the connection groove 62b, and then flows along the wall surface of the connection groove 62b. The collision further reduces the fluid energy of the gas. Namely, while the gas moves from the introduction portion 51 to the heat exchange portion 70, in other words, while the gas moves through the circulation portion 60, the gas loses fluid energy. Namely, the gas loses fluid energy as the gas moves downstream. In this state, the movement of the gas located on a downstream side is not governed by fluid energies such as the kinetic energy and the pressure energy of the gas. It can rather be said that the gas on a downstream side is pushed out by the movement of the gas on an upstream side. The turbulence of flow is unlikely to be generated because of such movement of the gas.

The gas that has moved to the heat exchange portion 70 moves to the third flow path 71 via the receiving ports 71a. The gas flows and falls from the receiving ports 71a toward the lower wall surface 71c of the third flow path 71. Then, the gas that has moved to the third flow path 71 moves between the fins 57. In more detail, the gas flows along base portions of the fins 57. Alternatively, it can be said that the gas flows along a main surface of the fin base 56 to which the base portions of the fins 57 are connected.

The fin base 56 is in contact with the lower wall surface 71c. Heat generated by the light source unit 40 transfers to the cooling block 52 via the connection surface 41b and the block lower surface 52b (refer to arrow H1). Further, the heat transfers to the fin base 56 via the lower wall surface 71c (refer to arrow H2). Namely, the fin base 56 is relatively hot in the heat sinks 54. Then, when the main flow of the gas is formed in a portion that is relatively hot, a temperature difference between the heat sinks 54 that are a high-temperature side and the gas that is a low-temperature side increases. A heat flow rate moving from the high-temperature side to the low-temperature side is proportional to the temperature difference. Therefore, heat transfers more efficiently from the heat sinks 54 to the gas, for example, when the main flow of the gas is formed on a base end side of the fins 57 (fin base 56 side) than when the main flow of the gas is formed on a tip side of the fins 57. The gas flows toward the exhaust port 71b while receiving heat (refer to arrow HG).

Figure 4:
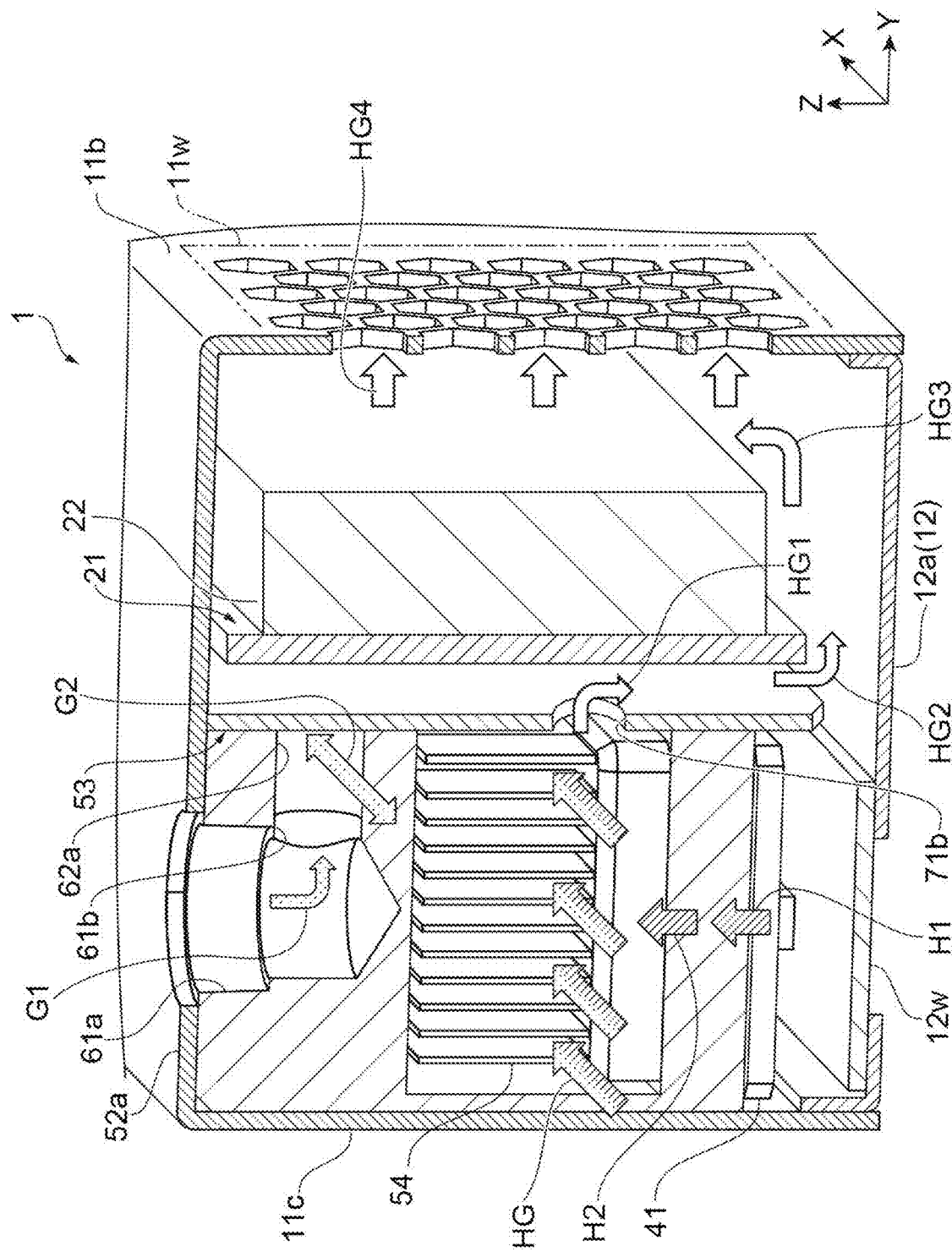
FIG. 4 is a cross-sectional view of the light emitting device of FIG. 1.

Then, as illustrated in FIG. 4, the gas moves from the exhaust port 71b to the outside of the third flow path 71 (refer to arrow HG1). As described above, the exhaust port 71b is provided in the cover 53. The circuit substrate 21 is disposed on a back side of the cover 53 with respect to a surface of the cover 53 which is in contact with the cooling block 52. Therefore, the gas discharged from the exhaust port 71b flows between the cover 53 and the circuit substrate 21 (refer to arrow HG2). Then, the gas passes through a gap between the circuit substrate 2 and the lower case 12 (refer to arrow HG3), and flows between the circuit substrate 21 and the case front surface 11b. The electronic component 22 is disposed in a space between the circuit substrate 21 and the case front surface 11b. Therefore, the gas is also capable of receiving heat from the electronic component 22 while moving through the space. Namely, the gas is used not only to cool the light source unit 40, but also to cool the circuit unit 20. Then, the gas is discharged from the exhaust window 11w of the upper case 11 (refer to arrow HG4).

The light emitting device 1 includes the cooling unit 50 that discharges heat to the outside of the housing 10 by means of the gas, the heat being generated by the light source unit 40. The cooling unit 50 receives the gas that is a heat medium from the introduction portion 51, and provides the gas to the heat exchange portion 70 via the circulation portion 60. Since the gas is compressed, the gas has fluid energy caused by the compression. First, the gas moves from the introduction portion 51 to the first flow path 61 of the circulation portion 60. When the gas moves from the introduction portion 51 to the first flow path 61, the flow path area expands. As a result, when the gas moves from the introduction portion 51 to the first flow path 61 of the circulation portion 60, the fluid energy of the gas is reduced. Further, while the gas moves to the heat exchange portion 70, the gas passes through the first flow path 61 and the second flow path 62 of the circulation portion 60. Here, a direction of the second flow path 62 intersects a direction of the first flow path 61. In that case, a flow direction of the gas changes when the gas moves from the first flow path 61 to the second flow path 62. At this time, the fluid energy of the gas is further reduced. As a result, the gas of which the fluid energy is sufficiently reduced is provided to the heat exchange portion 70, so that the turbulence of the flow of the gas in the heat exchange portion 70 is suppressed. Therefore, the flow of the gas in the heat exchange portion 70 is made uniform, so that a deviation in the amount of heat moving from the heat exchange portion 70 to the gas is eliminated. As a result, the temperature variation of the light source unit 40 is reduced, and the light output can be made as uniform as possible.

Second Embodiment

Figure 5:
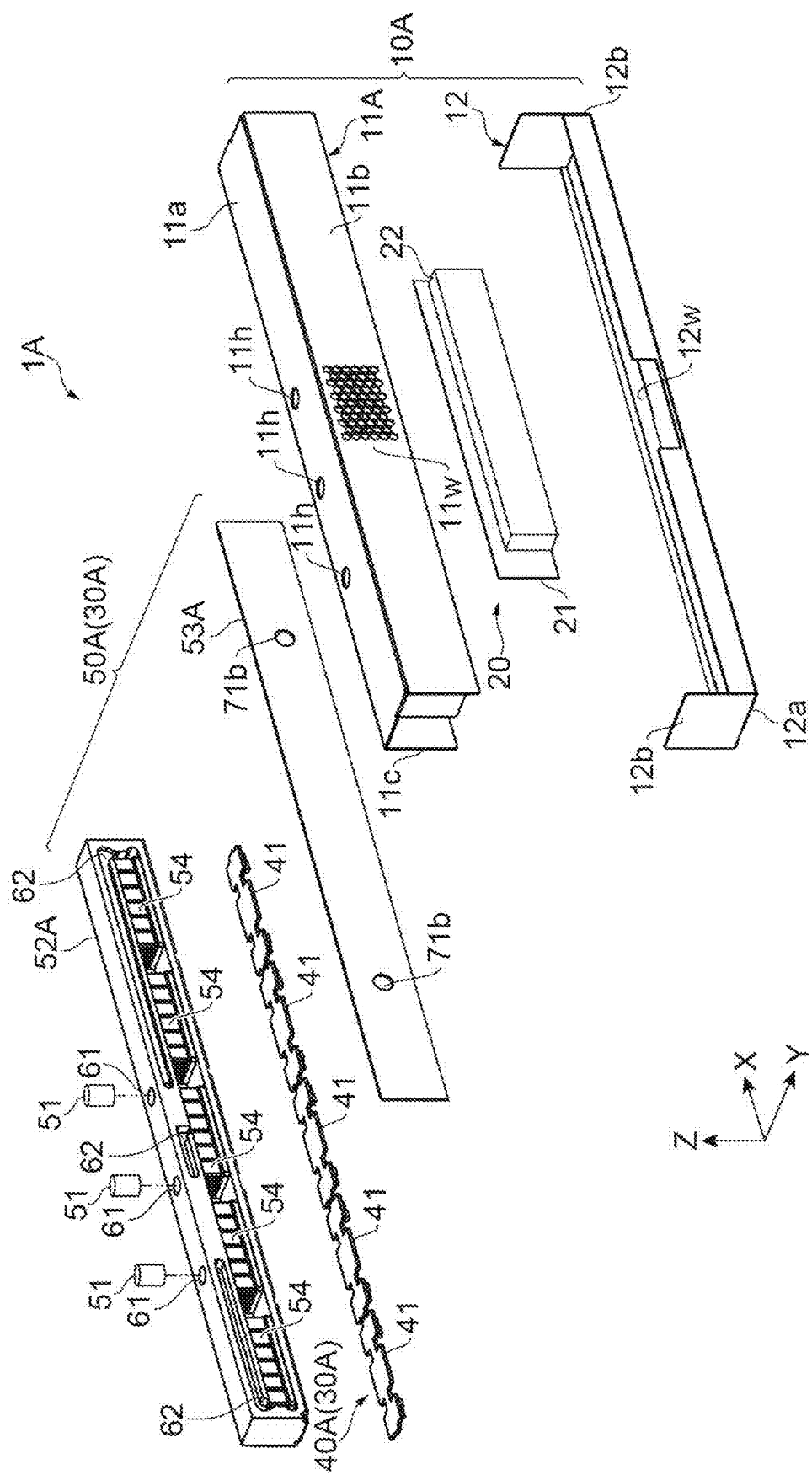
FIG. 5 is an exploded perspective view illustrating a light emitting device of a second embodiment.

As shown in FIG. 5, a light emitting device 1A of the second embodiment includes a housing 10A, the circuit unit 20, and a light emitting unit 30A. A length of a light receiving region of the light emitting device 1A of the second embodiment is longer than a length of a light receiving region of the light emitting device 1 of the first embodiment. Therefore, a region that has to be cooled by a cooling unit 50A of the second embodiment is larger than a region that has to be cooled by the cooling unit 50 of the first embodiment. Hence, the cooling unit 50A of the second embodiment adopts a configuration for reducing the temperature difference in an expanded region to be cooled. Namely, the cooling unit 50A of the light emitting device 1A is different from the cooling unit 50 of the light emitting device 1 of the first embodiment. Hereinbelow, the cooling unit 50A will be described in detail. The other housing 10A and the circuit unit 20 will be described as necessary and a detailed description will be omitted.

Figure 6:
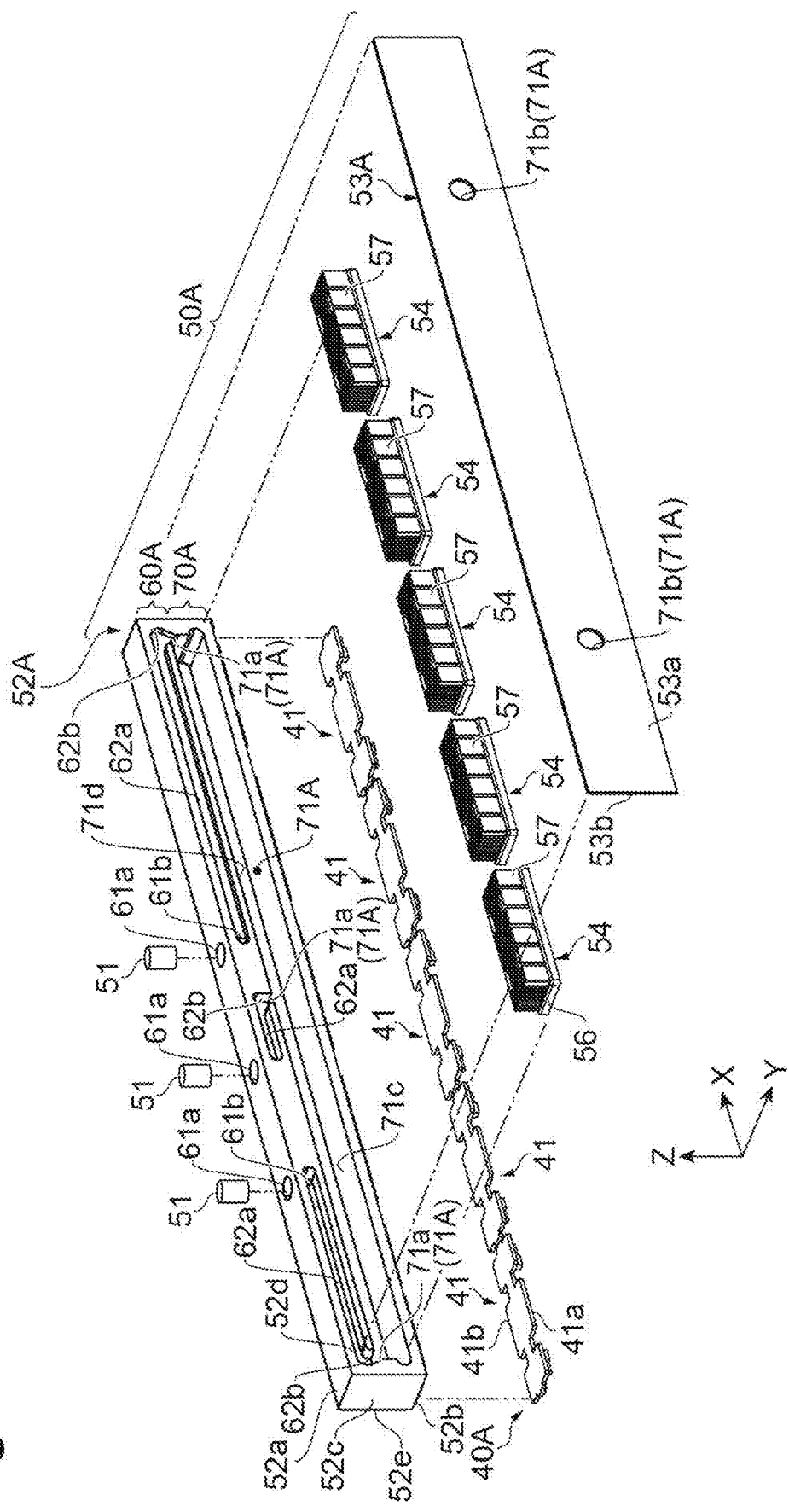
FIG. 6 is an exploded perspective view illustrating a cooling unit of FIG. 5.

As illustrated in FIG. 6, the cooling unit 50A includes the introduction portion 51, a cooling block 52A, a cover 53A, and the heat sink 54. A length of the cooling block 52A is longer than the length of the cooling block 52 of the first embodiment. Hence, five heat sinks 54 are disposed in a third flow path 71A of the cooling unit 50A. In addition, the number of the introduction portions 51 of the cooling unit 50 of the first embodiment is 1. On the other hand, the number of the introduction portions 51 of the cooling unit 50A of the second embodiment is 3. Namely, the cooling unit 50A receives a supply of the gas from three places.

Figure 7:
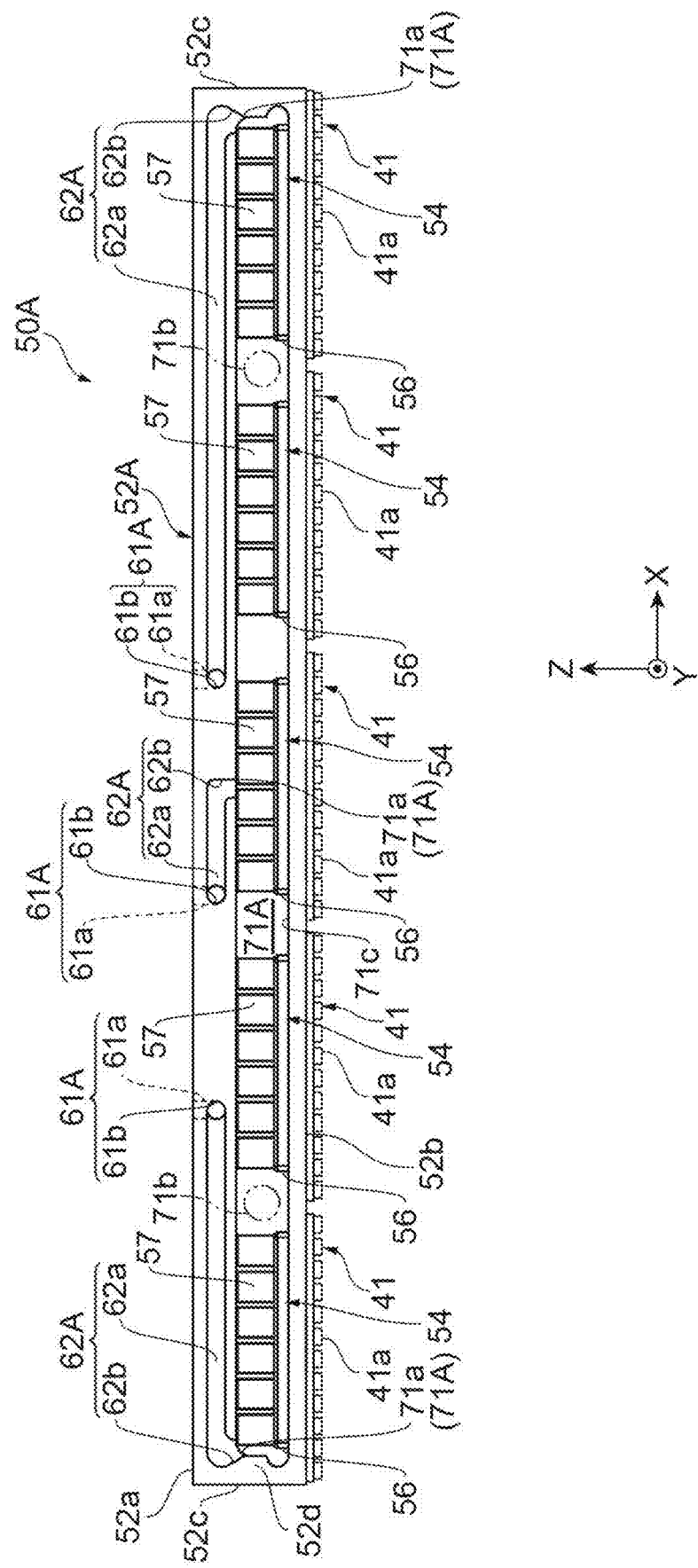
FIG. 7 is a plan view of the cooling unit.

As illustrated in FIG. 7, a first flow path 61A includes three flow path holes 61a and three connection holes 61b. One flow path hole 61a is connected to one connection hole 61b. Namely, one flow path hole 61a is not connected to two or more connection holes 61b. Therefore, the first flow path 61A includes three paths, in each of which the flow path hole 61a is connected in series to the connection hole 61b.

A second flow path 62A includes three flow path grooves 62a and three connection grooves 62b. One flow path groove 62a is connected to one connection hole 61b. Namely, one flow path groove 62a is not connected to two or more connection holes 61b. Further, one flow path groove 62a is connected to one connection groove 62b, and one flow path groove 62a is not connected to two or more connection grooves 62b. According to the above-described connection configuration, the second flow path 62A includes three paths, in each of which the flow path groove 62a is connected in series to the connection groove 62b.

The third flow path 71A has three receiving ports 71a and two exhaust ports 71b (refer to FIG. 6). A first receiving port 71a is disposed in the vicinity of the one block end surface 52c of the cooling block 52. A second receiving port 71a is disposed in the vicinity of the other block end surface 52c of the cooling block 52. A third receiving port 71a is disposed at the center of the cooling block 52A.

Incidentally, the connection grooves 62b disposed on both sides may not have a constant groove width. Namely, the connection groove 62b may include a portion of which the groove width is expanded. For example, the widened portion of the connection groove 62b is provided between an inlet of the flow path groove 62a and an outlet that is the receiving port 71a, the inlet having the same groove width as that of the widened portion. The widened portion is provided at a corner at which the flow direction changes. A groove width of the widened portion is larger than the groove width of the flow path groove 62a. In addition, the groove width of the widened portion is larger than a width of the receiving port 71a.

The exhaust port 71b is disposed between a pair of the receiving ports 71a adjacent to each other.

The gas moves in order of the introduction portion 51, a circulation portion 60A, and a heat exchange portion 70A. As described above, the circulation portion 60A includes three paths, in each of which the flow path hole 61a, the connection hole 61b, the flow path groove 62a, and the connection groove 62b are connected in series to each other. Therefore, the number of the paths through which the gas is supplied to the heat exchange portion 70A is 3.

Similarly to the light emitting device 1 of the first embodiment, the light emitting device 1A of the second embodiment is capable of making a temperature distribution of a light source unit 40A as uniform as possible. As a result, the light emitting device 1A of the second embodiment is capable of making the light output as uniform as possible.

Further, according to this configuration, the distance from the receiving port 71a to the exhaust port 71b is shortened. For example, when the distance from the receiving port 71a to the exhaust port 71b is long, a large amount of heat easily transfers from the heat sink 54 to the gas in the vicinity of the receiving port 71a in which the temperature difference is large. Namely, the temperature of the light source unit 40A is easily lowered. Hence, the gas continues to receive heat as the gas approaches the exhaust port 71b, so that the temperature of the gas gradually rises. In that case, since the temperature difference between the gas and the heat sinks 54 decreases, the transfer of heat from the heat sinks 54 to the gas becomes difficult as the gas approaches a downstream side. Namely, the decreasing of the temperature of the light source unit 40A becomes difficult.

On the other hand, when the distance from the receiving port 71a to the exhaust port 71b is short, the distance at which the gas receives heat from the heat sinks 54 is shortened. As a result, the rising of the temperature of the gas that has reached the exhaust port 71b becomes difficult. In that case, the temperature difference between the heat sinks 54 and the gas can be prevented from decreasing too much. Therefore, a state is easily maintained where heat easily transfers from the heat sinks 54 to the gas.

The light emitting device of the present invention is not limited to the above embodiments.

First Modification Example

Figure 8:
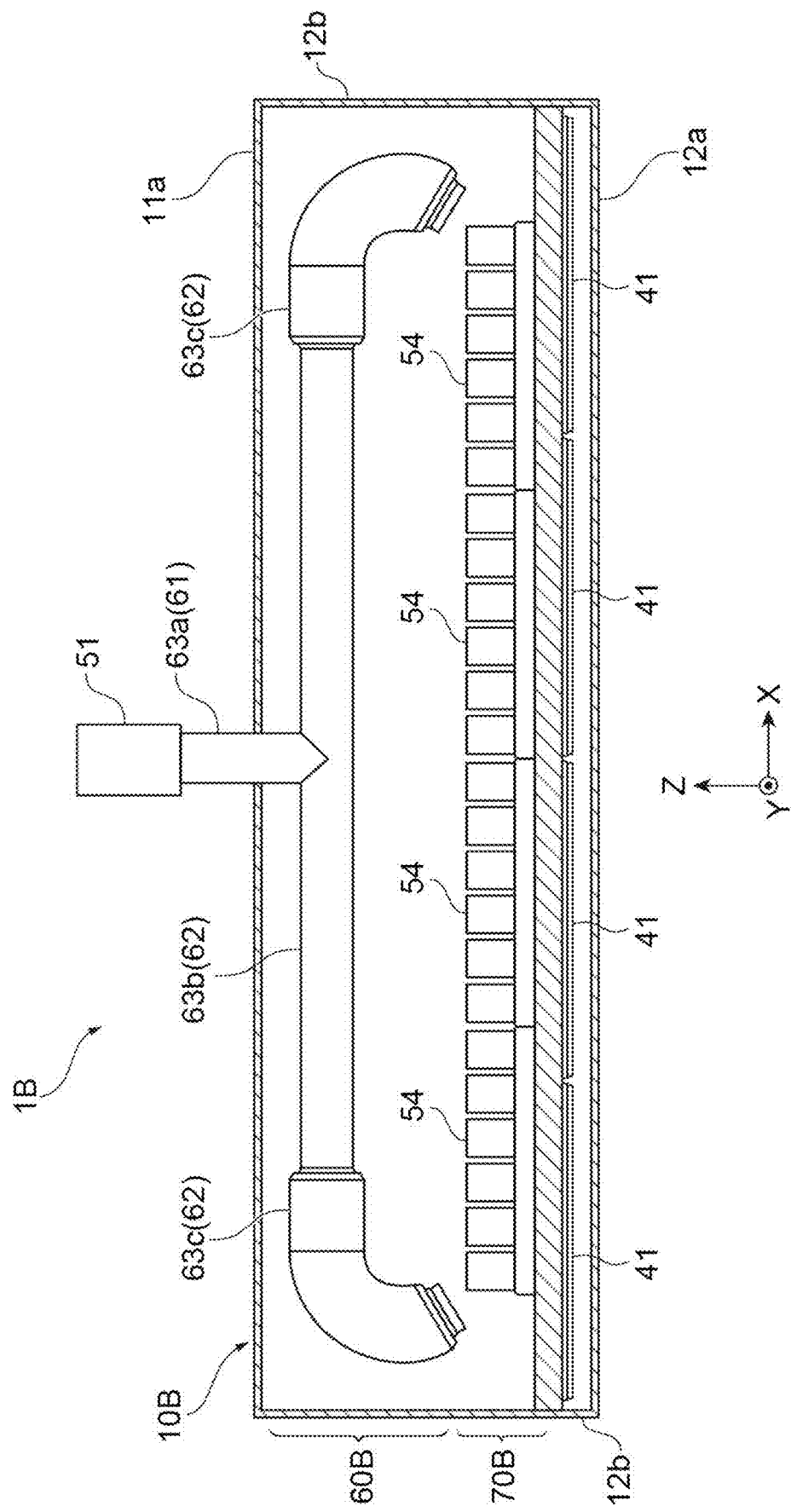
FIG. 8 is a view illustrating a cooling unit provided in a light emitting device of a first modification example.

FIG. 8 illustrates a light emitting device 1B of a first modification example. A circulation portion 60B of the light emitting device 1B may be formed of a pipe member. The circulation portion 60B receives the gas from one inlet, and provides the gas to a heat exchange portion 70B from two outlets.

The circulation portion 60B includes a receiving pipe 63a, a branch pipe 63b, and supply pipes 63c. A flow path area (cross-sectional area) of each of the receiving pipe 63a and the branch pipe 63b may be the same as a flow path area of the supply pipe 63c. The receiving pipe 63a forms the first flow path 61. The branch pipe 63b and the supply pipes 63c form the second flow path 62. The receiving pipe 63a extends from the case upper surface 11a toward the case lower surface 12a. An upstream end of the receiving pipe 63a protrudes from the case upper surface 11a. The introduction portion 51 is connected to the protruding portion. A downstream end of the receiving pipe 63a is disposed inside a housing 10B. The branch pipe 63b is connected to the downstream end of the receiving pipe 63a.

The branch pipe 63b extends from the one case end surface 12b toward the other case end surface 12b. One end portion of the branch pipe 63b is disposed in the vicinity of the one case end surface 12b. The other end portion of the receiving pipe 63a is disposed in the vicinity of the other case end surface 12b.

The supply pipe 63c is a separate component from the branch pipe 63b. The supply pipes 63c are connected to end portions of the branch pipe 63b. The supply pipe 63c directs a flow direction of the gas toward the heat sink 54 of the heat exchange portion 70B. A supply port of the supply pipe 63c faces the heat sink 54 of the heat exchange portion 70B.

Incidentally, the branch pipe 63b and the supply pipes 63c may be formed by bending the vicinities of both ends of one cylindrical member. Namely, the branch pipe 63b and the supply pipes 63c may be an integral component.

The light emitting device 1B including the circulation portion 60B formed of a pipe-shaped component is also capable of obtaining the same effects as those of the light emitting device 1 of the first embodiment.

Second Modification Example

Figure 9:
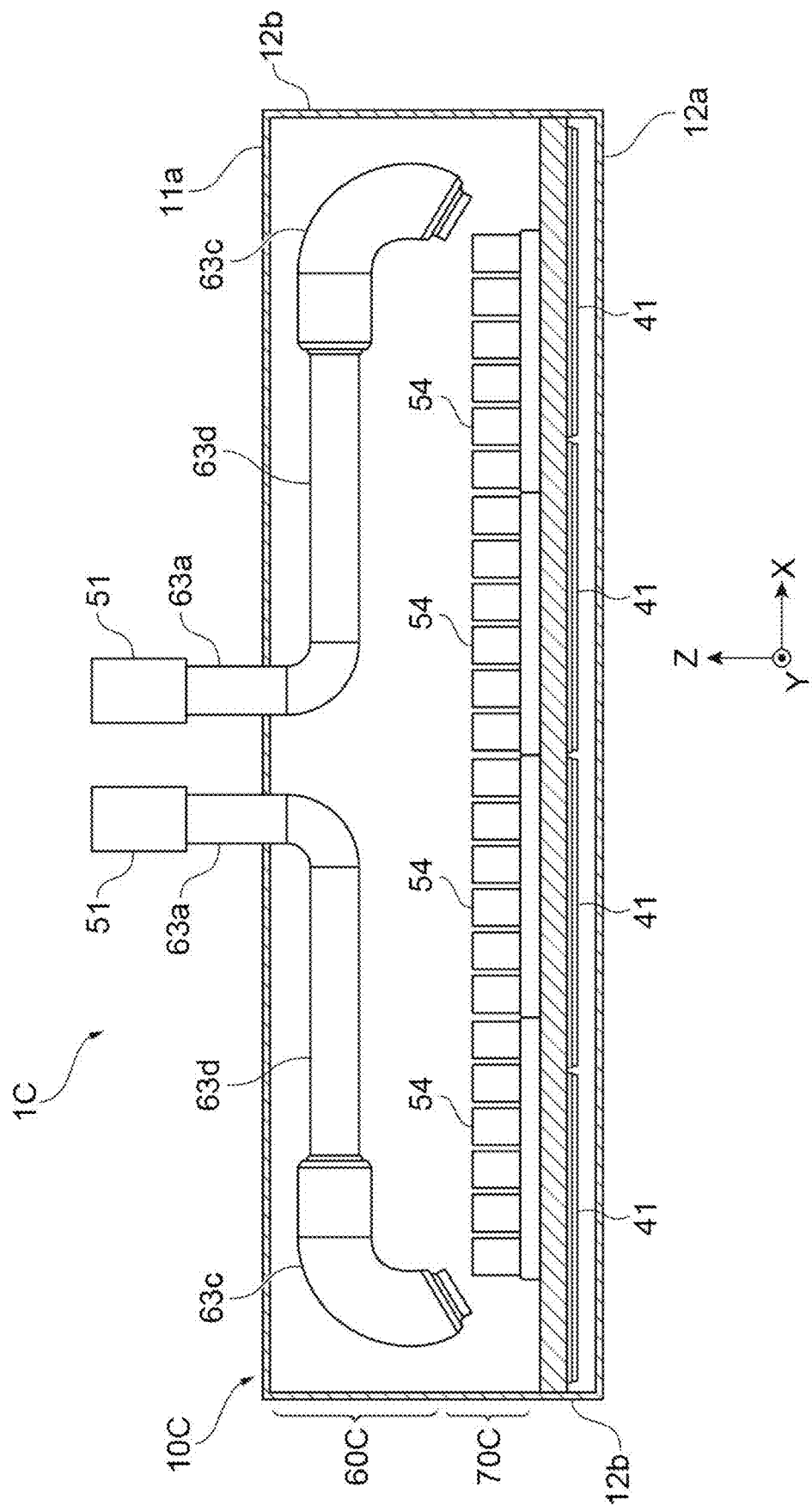
FIG. 9 is a view illustrating a cooling unit provided in a light emitting device of a second modification example.

FIG. 9 illustrates a light emitting device 1C of a second modification example. Similarly to the light emitting device 1B of the first modification example, in the light emitting device 1C of the second modification example, a circulation portion 60C disposed inside a housing 10C is formed of a pipe-shaped member. On the other hand, in the first modification example, the gas is received from one inlet, and the gas is provided to the heat exchange portion 70B from two outlets. In the second modification example, two sets of configurations are provided in each of which the gas is received from one inlet and the gas is provided to a heat exchange portion 70C from one outlet. The circulation portion 60C includes the receiving pipes 63a, connection pipes 63d, and the supply pipes 63c. One receiving pipe 63a, one connection pipe 63d, and one supply pipe 63c are connected in series to each other to form one path.

The light emitting device 1C including the circulation portion 60C of the second modification example is also capable of obtaining the same effects as those of the light emitting device 1 of the first embodiment. In addition, the circulation portion 60C of the second modification example receives the gas from two receiving pipes 63a. Therefore, the flow rate of the gas to be supplied to the heat exchange portion 70C is easily increased.

Third Modification Example

Figure 10:
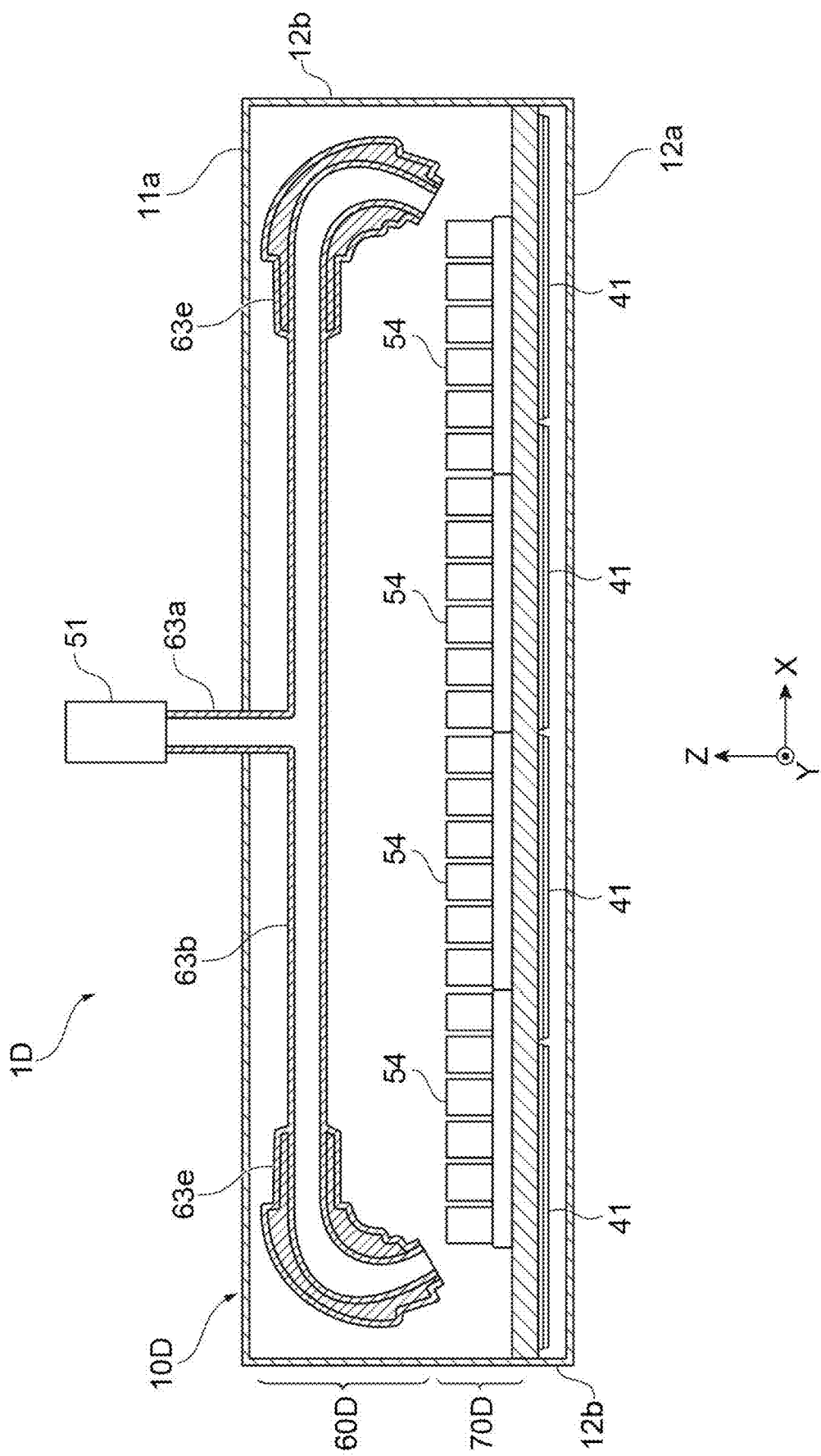
FIG. 10 is a view illustrating a cooling unit provided in a light emitting device of a third modification example.

FIG. 10 illustrates a light emitting device 1D of a third modification example. In the light emitting device 1B of the first modification example, the receiving pipe 63*a*, the branch pipe 63*b*, and the supply pipe 63*c* have the same flow path area. The light emitting device 1D of the third modification example includes the branch pipe 63*b* and supply pipes 63*e* that are disposed inside a housing 10D. The receiving pipe 63*a*, the branch pipe 63*b*, and the supply pipe 63*e* have different flow path areas. The flow path area of the receiving pipe 63*a* is the same as the flow path area of the branch pipe 63*b*. In other words, the flow path area is constant from an inlet of the receiving pipe 63*a* to an outlet of the branch pipe 63*b*. On the other hand, the flow path area of the supply pipe 63*e* changes continuously along a flow direction.

The flow path area of an inlet of the supply pipe 63*e* is the same as the flow path area of the outlet of the branch pipe 63*b*. The flow path area of the supply pipe 63*e* expands continuously toward a downstream side. Then, the flow path area is maximized in a portion of the supply pipe 63*e* of which the curvature is maximized. Thereafter, the flow path area decreases continuously toward an outlet of the supply pipe 63*e*.

The light emitting device 1D including the circulation portion 60D of the third modification example is also capable of obtaining the same effects as those of the light emitting device 1 of the first embodiment. In addition, since the flow path area of the supply pipe 63*e* is made variable, a state (flow speed, pressure) of the gas to be supplied to a heat exchange portion 70D can be controlled to a more suitable state.

Fourth Modification Example

Figure 11:
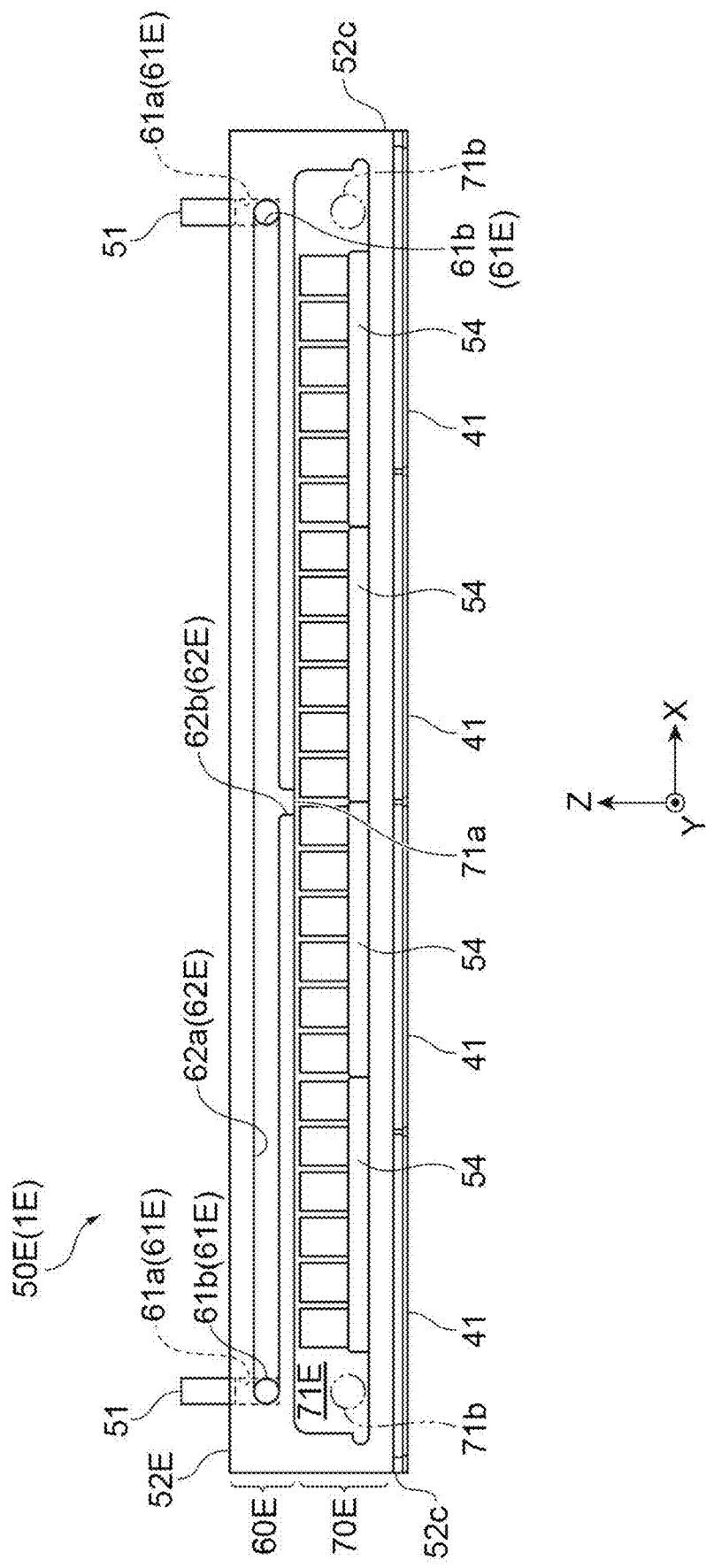
FIG. 11 is a view illustrating a cooling unit provided in a light emitting device of a fourth modification example.

FIG. 11 illustrates a light emitting device 1E of a fourth modification example. In the light emitting device 1 of the first embodiment, the gas is received from one inlet, and the gas is provided to the heat exchange portion 70 from two outlets. In the light emitting device 1E of the fourth modification example, the gas is received from two inlets, and the gas is provided to a heat exchange portion 70E from one outlet. Similarly to the light emitting device 1 of the first embodiment, a cooling unit 50E of the light emitting device 1E of the fourth modification example includes a groove provided in a cooling block 52E and a cover that closes the groove.

A first flow path 61E includes two flow path holes 61*a* and two connection holes 61*b*. One flow path hole 61*a* is disposed in the vicinity of the one block end surface 52*c*. The other flow path hole 61*a* is disposed in the vicinity of the other block end surface 52*c*. A second flow path 62E includes one flow path groove 62*a* and one connection groove 62*b*. The flow path groove 62*a* extends from the one block end surface 52*c* toward the other block end surface 52*c*. The connection holes 61*b* are connected to both ends of the flow path groove 62*a*. The connection groove 62*b* is connected to the center of the flow path groove 62*a*. The receiving port 71*a* of a third flow path 71E is provided at the center of a distance from the one block end surface 52*c* to the other block end surface 52*c*. The exhaust ports 71*b* of the third flow path 71E are provided at both ends of the third flow path 71E.

The light emitting device 1E including the cooling unit 50E of the fourth modification example is also capable of obtaining the same effects as those of the light emitting device 1 of the first embodiment.

Fifth Modification Example

Figure 12:
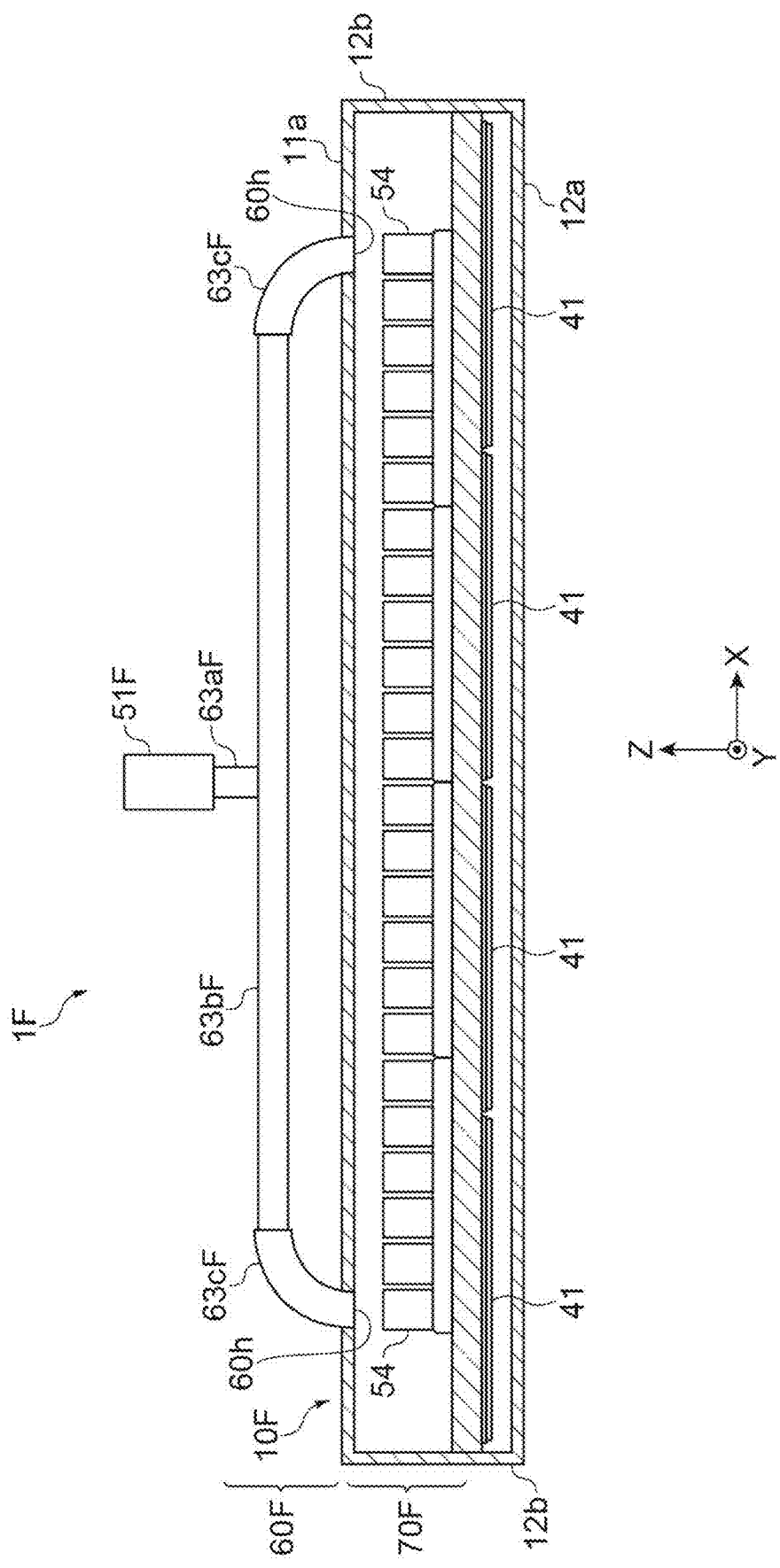
FIG. 12 is a view illustrating a cooling unit provided in a light emitting device of a fifth modification example.

FIG. 12 illustrates a light emitting device 1F of a fifth modification example. As described above, the circulation portion 60 of the light emitting device 1 of the first embodiment is provided inside the housing 10. Here, from the viewpoint of obtaining a cooling effect of making the light output as uniform as possible, the fluid energy of the gas may be reduced until the gas is supplied to the heat exchange portion, and the reduction of the fluid energy is achieved by a flow path configuration from the introduction portion to the heat exchange portion. Namely, when such a flow path configuration is provided, a satisfactory cooling characteristic can be obtained. At this time, whether the flow path configuration is disposed inside the housing or is disposed outside the housing is important from a perspective of the assembly of the light emitting device or from a perspective of the size of the light emitting device. However, the flow path configuration does not affect an effect of making the light output as uniform as possible.

Hence, the light emitting device 1F of the fifth modification example includes a circulation portion 60F disposed inside a housing 10F and a heat exchange portion 70F disposed outside the housing 10F. The circulation portion 60F includes a receiving pipe 63*a*F, a branch pipe 63*b*F, and supply pipes 63*c*F. An introduction portion 51F is connected to the receiving pipe 63*a*F. Further, the receiving pipe 63*a*F is connected to substantially the center of the branch pipe 63*b*F. The branch pipe 63*b*F extends in a longitudinal direction of the housing 10F. The supply pipes 63*c*F are connected to both ends of the branch pipe 63*b*F. An output port 60*h* of the circulation portion 60F which is an output port of the supply pipe 63*c*F is connected to the case upper surface 11*a* of the housing 10F. The gas of which the momentum is reduced flows from the output port 60*h* toward the heat sink 54 of the heat exchange portion 70F. Incidentally, the housing 10F may be provided with at least one or more holes to which the output ports 60*h* are connected. The light emitting device 1F including the circulation portion 60F of the fifth modification example is also capable of obtaining the same effects as those of the light emitting device 1 of the first embodiment.

Hereinafter, results of confirmation of the actions and effects of the light emitting devices of the embodiments using analysis or the like will be described.

Comparative Example 1

Figure 13:
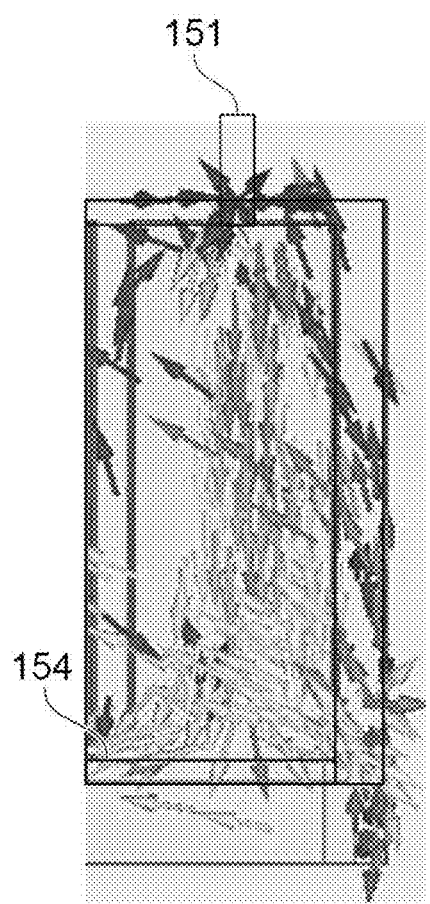
FIG. 13 is a view illustrating a result of Comparative Example 1.

As Comparative Example 1, in a cooling structure of a configuration that was different from the cooling unit 50 of the present embodiment, the flow of gas was confirmed by numerical calculation. In the cooling structure of Comparative Example 1, high-pressure gas is directly provided to a heat sink. As illustrated in FIG. 13, in the cooling structure of Comparative Example 1, a heat sink 154 is disposed on an extension line of a flow direction of the gas that has flowed out from an introduction portion 151. Then, a member that obstructs the flow of the gas is not disposed between the introduction portion 151 and the heat sink 154.

FIG. 13 illustrates the flow direction of the gas ejected from the introduction portion 151 to a space in which the heat sink 154 is disposed. Referring to FIG. 13, the gas flows linearly from the introduction portion 151, and then collides with the heat sink 154. The colliding gas receives a reaction force from the heat sink 154 to change the flow direction. The change of the flow direction is irregular. As a result, the flow of the gas is turbulent in the space in which the heat sink 154 is disposed. Namely, it can be said that the gas is in a turbulent state. The turbulent state simply means that the flow direction is irregularly turbulent, and does not necessarily have to coincide with the definition of a turbulent flow in fluid dynamics. According to such a flow of the gas, fresh gas is supplied to a region on the heat sink 154, the region being located on a flow line of the gas to be ejected from the introduction portion 151. Namely, heat easily transfers from the heat sink 154 to the gas. As a result, the heat sink 154 is cooled. On the other hand, fresh gas is not provided to a region on the heat sink 154, the region being not located on the flow line of the gas. As a result, a portion of which the cooling is easily and a portion of which the cooling is difficult are generated in the heat sink 154. Namely, a non-uniform temperature distribution is generated in a light source unit that is thermally connected to the heat sink 154. From a result of Comparative Example 1, it could be predicted that a large temperature gradient was generated to cause an increase in temperature difference between a high-temperature portion and a low-temperature portion of the light source unit.

Comparative Example 2

In Comparative Example 1, in the cooling structure of the configuration that was different from the cooling unit 50 of the present embodiment, an increase in temperature difference between the high-temperature portion and the low-temperature portion of the light source unit was predicted. In Comparative Example 2, this prediction was confirmed.

Figure 14:
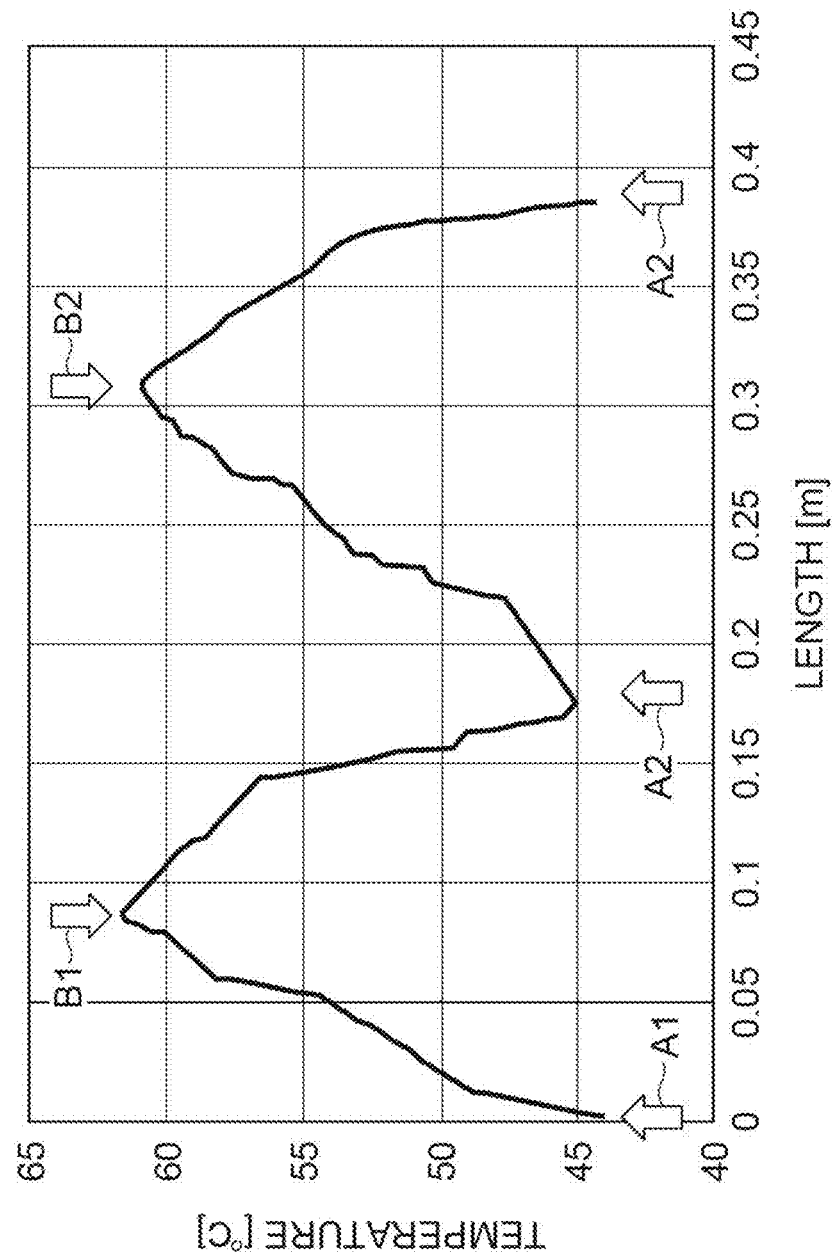
FIG. 14 is a view illustrating a result of Comparative Example 2.

FIG. 14 is a graph illustrating a result of the confirmation. The horizontal axis of the graph indicates a position in a longitudinal direction of a light emitting device. The vertical axis of the graph indicates a temperature of a light source unit. 0 in on the horizontal axis indicates the position of one block end surface. 0.38 m indicates the position of the other block end surface. Then, the light emitting device of Comparative Example 2 supplies high-pressure gas from three places such as the one end portion, the other end portion, and the center. The pressure of the gas was, for example, 0.3 MPa. Namely, a heat exchange portion includes three receiving ports. In the graph, arrows A1, A2, and A3 indicate the positions of the receiving ports. Then, the heat exchange portion includes two exhaust ports. Arrows B1 and B2 indicate the positions of the exhaust ports.

Referring to the graph, it was found that the temperature of the light source unit decreased at its maximum at the positions (arrows A1, A2, and A3) of the receiving ports. Then, it was found that the temperature of the light source unit increased from the receiving port toward the exhaust port and a highest temperature was reached in the vicinity of the exhaust port. For example, a temperature difference between a lowest temperature and the highest temperature difference was approximately 12° C. Namely, it was found that satisfactory heat transfer from the light source unit to the gas became difficult as the gas approached the exhaust port from the receiving port. Therefore, as predicted in Comparative Example 1, it could be confirmed that a large temperature gradient was generated to cause an increase in temperature difference between a high-temperature portion and a low-temperature portion of the light source unit.

Example 1

Figure 15:
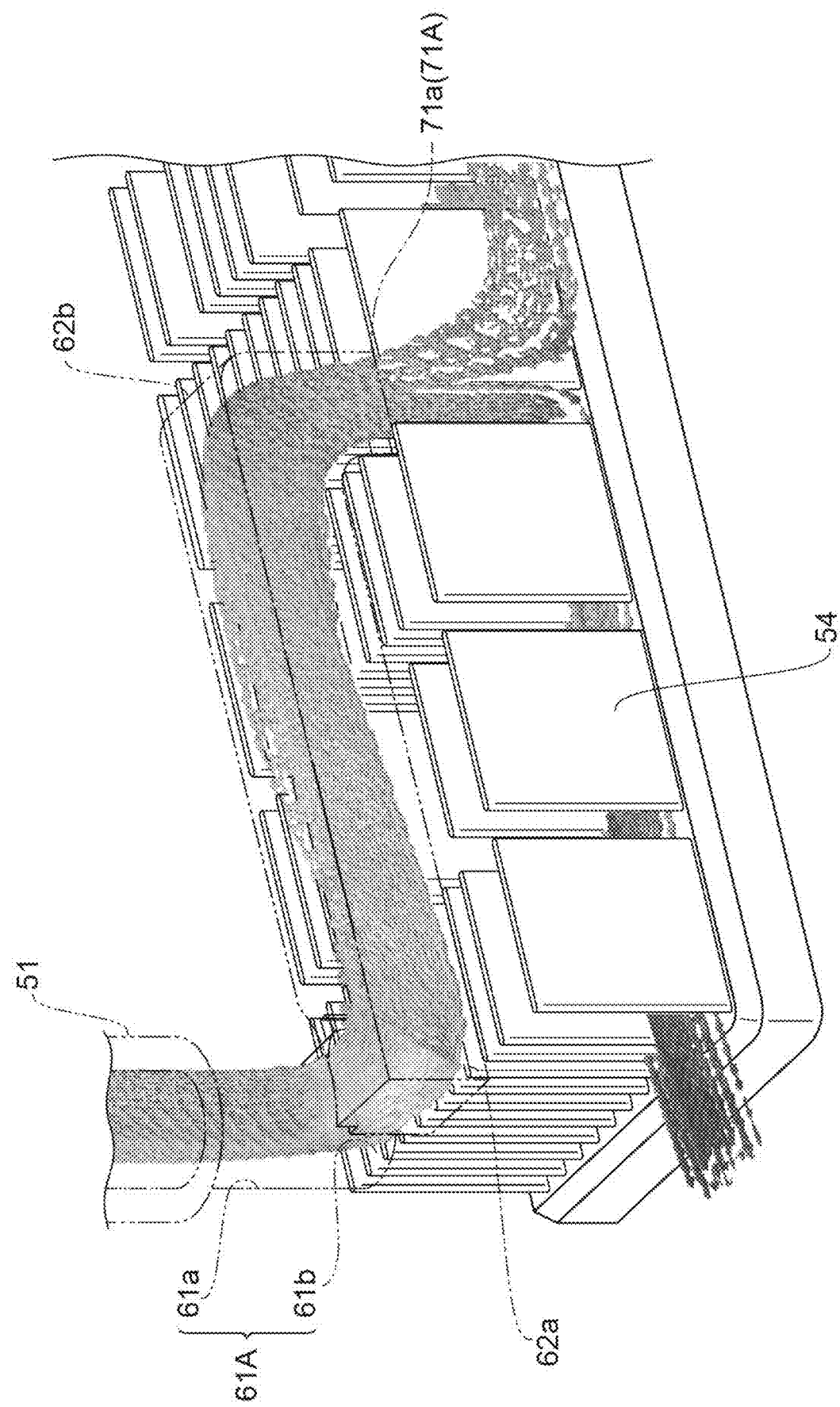
FIG. 15 is a view illustrating a result of Example 1.

In Example 1, the effects of the cooling unit 50A of the second embodiment were confirmed. In Example 1, a central portion of the cooling unit 50E of the second embodiment was adopted as an analysis model. FIG. 15 illustrates a result of analysis of the flow of gas moving from the first flow path 61A to the third flow path 71A. In FIG. 15, the flow speed of the gas is illustrated by shading. Referring to FIG. 15, it was found that the flow speed of the gas was reduced in each of a portion in which the flow path hole 61a was connected to the connection hole 61b, a portion in which the connection hole 61b was connected to the flow path groove 62a, and a portion in which the flow path groove 62a was connected to the connection groove 62b. Further, it was found that the main flow of the gas was formed on a lower side of the third flow path 71A, namely, on a lower side of the heat sinks 54. From this result, it was found that according to structures for securing an air volume such as the connection hole 61b and the connection groove 62b, the generation of a turbulent flow was suppressed and the gas could be provided to the heat sinks 54 in a laminar flow state. As a result, it was confirmed that the heat exhaust efficiency of the heat sinks 54 was improved since the flow of the gas was formed without waste.

Example 2

Figure 16:
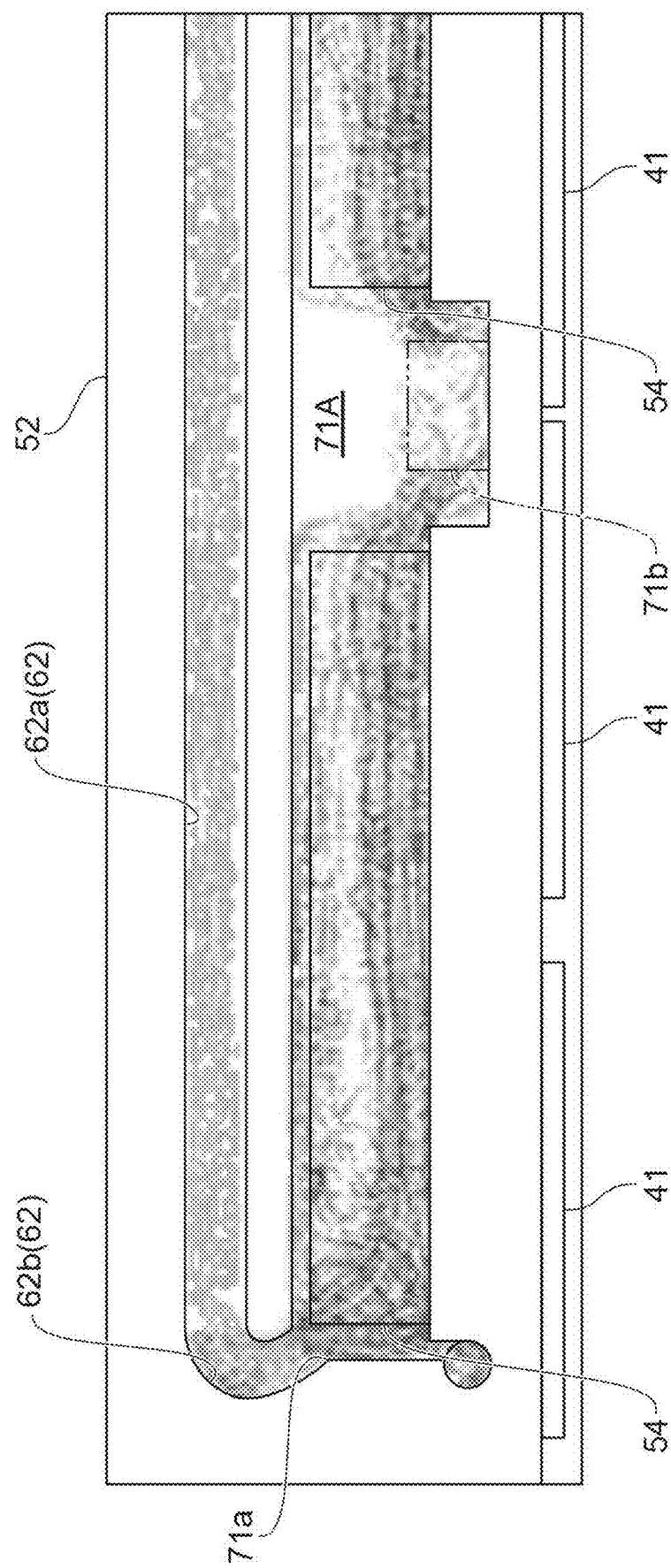
FIG. 16 is a view illustrating a result of Example 2.

In Example 2, the effects of the cooling unit 50A of the second embodiment were confirmed. In Example 2, the cooling unit 50A of the second embodiment was adopted as an analysis model. FIG. 16 illustrates a result of analysis of the flow of gas moving from the second flow path 62 to the third flow path 71A. In FIG. 16, the flow speed of the gas is illustrated by shading. Referring to FIG. 16, it was found that the flow speed of the gas was relatively large on upstream sides of corners of the flow path groove 62a and the connection groove 62b. On the other hand, it was found that the flow speed of the gas was significantly reduced on a downstream side of the corner of the connection groove 62b and particularly, on a downstream side of the receiving port 71a of the third flow path 71A. Further, it was found that the main flow of the gas was formed on the lower side of the third flow path 71A, namely, a bottom portion side of the heat sinks 54. From this result, it was confirmed that similarly to the cooling unit 50 of the first embodiment, the heat exhaust efficiency of the heat sinks 54 was also improved by the cooling unit 50A of the second embodiment.

Example 3

Figure 17:
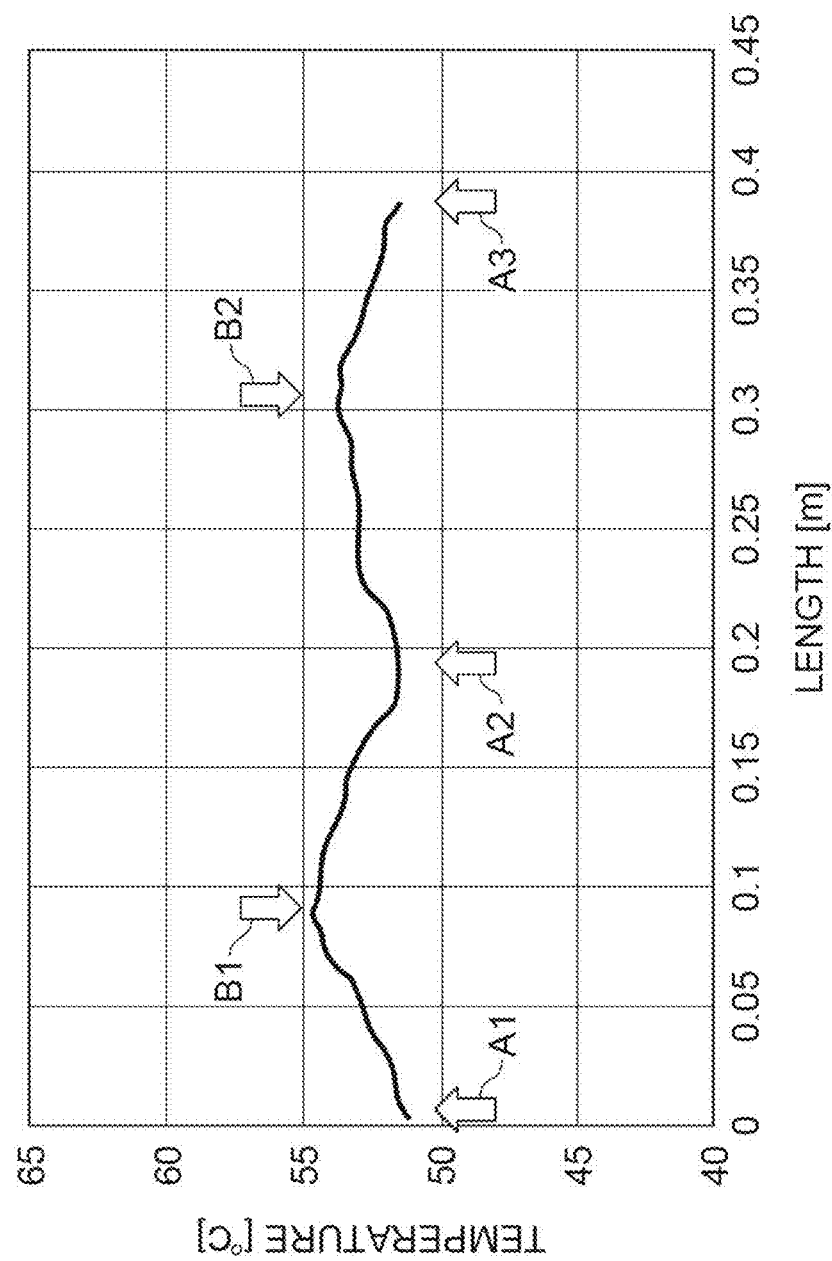
FIG. 17 is a view illustrating a result of Example 3.

In Example 3, the same confirmation as in Comparative Example 2 was performed. Namely, a temperature distribution of a light source unit in a longitudinal direction of a light emitting device was confirmed. Analysis conditions (for example, pressure of high-pressure air: 0.3 MPa) are the same as those in Comparative Example 2. In Example 3, the same configuration as the cooling unit 50A of the light emitting device 1A of the second embodiment was adopted as an analysis model. FIG. 17 is a graph illustrating a result of the confirmation.

Referring to the graph, a tendency of a rough temperature distribution was similar to that of Comparative Example 2 (FIG. 14). Namely, it was found that the temperature of the light source unit decreased at its maximum at the positions (arrows A1, A2, and A3) of receiving ports. Then, it was found that the temperature of the light source unit 40 increased from the receiving port 71a toward the exhaust port 71b and a highest temperature was reached in the vicinity of the exhaust port 71b. On the other hand, a temperature difference between a lowest temperature and a highest temperature was clearly smaller than that in Comparative Example 2. The temperature difference in Comparative Example 2 was approximately 12° C. On the other hand, the temperature difference in Example 3 was approximately 4° C. Namely, as a result of an improvement in temperature gradient, it was found that heat transfer from the light source unit 40 to the gas was performed even when the gas approached the exhaust port 71b (for example, arrow B1) from the receiving port 71a (for example, arrow A1). From this result, it could confirmed that a flow direction of the gas having a momentum was changed by the connection groove 62b or the like to generate the flow of the gas having a good cooling efficiency and thus, a temperature distribution of the light source unit 40 could be made as uniform as possible.

REFERENCE SIGNS LIST 1, 1A, 1B, 1C, 1D, 1E: light emitting device, 10, 10A, 10B, 10C, 10D, 10F: housing, 11w: exhaust window, 12w: light emitting window, 21a: main surface, 40, 40A: light source unit, 41a: light emitting surface, 41b: connection surface, 50: cooling unit, 51, 51F, 151: introduction portion, 52, 52A, 52E: cooling block, 54: heat sink (heat radiation member), 57: fin, 60, 60A, 60B, 60F: circulation portion, 61, 61A, 61E: first flow path, 62, 62A, 62E: second flow path, 70, 70A, 70B, 70C, 70D, 70E, 70F: heat exchange portion, 71a: receiving port, 71b: exhaust port.

The invention claimed is:

1. A light emitting device comprising:
a housing;
a light source unit accommodated in the housing to emit light from a light emitting window of the housing, wherein the light source unit includes a light emitting surface on which a light emitting element emitting the light is disposed, and a connection surface opposite to the light emitting surface; and
a cooling unit provided to the housing to discharge heat to an outside of the housing by means of a gas, the heat being generated by the light source unit,
wherein the cooling unit includes an introduction portion that receives a provision of the gas that is compressed, a heat exchange portion that causes the gas to receive the heat generated by the light source unit, and a circulation portion that guides the gas from the introduction portion to the heat exchange portion,
the heat exchange portion includes a receiving port connected to the circulation portion, a heat radiation member disposed at a position opposing the receiving port that causes the gas to receive the heat generated by the light source unit, and an exhaust port that discharges the gas that has received the heat generated by the light source unit, wherein the heat radiation member is disposed on a connection surface side,
the circulation portion includes a first flow path being connected to the introduction portion and extending along a first direction, and a second flow path being connected to the first flow path, extending along a second direction intersecting the first direction, and being connected to the receiving port of the heat exchange portion, and
the first flow path includes a portion having a flow path area larger than a flow path area of the introduction portion.

2. The light emitting device according to claim 1, wherein the introduction portion is disposed on a back surface side of the housing opposite to a main surface of the housing, the emitting window being provided in the main surface.

3. The light emitting device according to claim 1, wherein the number of the receiving ports of the heat exchange portion is 2 or more.

4. The light emitting device according to claim 1, wherein the circulation portion is disposed inside the housing.

5. The light emitting device according to claim 1, wherein the circulation portion is disposed outside the housing.

6. The light emitting device according to claim 4, wherein the cooling unit includes a cooling block in which the heat exchange portion and the circulation portion are formed, and
the circulation portion is a space formed by cutting out a part of the cooling block.

7. The light emitting device according to claim 4, wherein the circulation portion is a pipe member disposed in the housing.

8. The light emitting device according to claim 1, wherein the number of the introduction portions of the cooling unit is 2 or more.

9. The light emitting device according to claim 1, wherein the gas is air or nitrogen.

10. The light emitting device according to claim 1, wherein the heat radiation member is a heat sink including a plurality of fins.

11. The light emitting device according to claim 1, wherein the housing includes an exhaust window that further discharges the gas to the outside, the gas being discharged from the exhaust port, and
the exhaust window is provided in a central portion of the housing.

12. The light emitting device according to claim 1, wherein
the heat radiation member is a heat sink including a plurality of fins,
the heat sink includes a fin base disposed on a rear surface side of the light source unit and receiving the heat generated by the light source unit, and a plurality of fins protruded from the fin base, and
the plurality of fins extend in a direction in which the fin base and the receiving port are opposed with each other.

* * * * *